US010008265B2

(12) United States Patent
Hsu

(10) Patent No.: US 10,008,265 B2
(45) Date of Patent: Jun. 26, 2018

(54) METHOD AND APPARATUS FOR PROVIDING THREE-DIMENSIONAL INTEGRATED NONVOLATILE MEMORY (NVM) AND DYNAMIC RANDOM ACCESS MEMORY (DRAM) MEMORY DEVICE

(71) Applicant: NEO Semiconductor, Inc., San Jose, CA (US)

(72) Inventor: Fu-Chang Hsu, San Jose, CA (US)

(73) Assignee: NEO Semiconductor, Inc., San Jose, CA (US)

(*) Notice: Subject to any disclaimer, the term of this patent is extended or adjusted under 35 U.S.C. 154(b) by 0 days. days.

(21) Appl. No.: 14/923,247

(22) Filed: Oct. 26, 2015

(65) Prior Publication Data
US 2016/0071591 A1 Mar. 10, 2016

Related U.S. Application Data

(63) Continuation-in-part of application No. 14/846,673, filed on Sep. 4, 2015.
(Continued)

(51) Int. Cl.
*G11C 14/00* (2006.01)
*G11C 16/04* (2006.01)
(Continued)

(52) U.S. Cl.
CPC .......... *G11C 14/0018* (2013.01); *G11C 5/025* (2013.01); *G11C 11/401* (2013.01);
(Continued)

(58) Field of Classification Search
CPC .... G11C 16/0483; G11C 11/401; G11C 5/025
(Continued)

(56) References Cited

U.S. PATENT DOCUMENTS 5,585,303 A 12/1996 Hong et al.
5,708,284 A 1/1998 Onishi
(Continued)

FOREIGN PATENT DOCUMENTS

EP 0877382 B1 3/2002

OTHER PUBLICATIONS

International Search Report, dated Feb. 12, 2016, for corresponding International Application No. PCT/US2015/057403.
(Continued)

*Primary Examiner* — Alexander Sofocleous
*Assistant Examiner* — Alfredo Bermudez Lozada
(74) *Attorney, Agent, or Firm* — Intellectual Property Law Group LLP

(57) ABSTRACT

A memory system is configured to store information using a hybrid volatile and nonvolatile memory device. The memory system, in one aspect, includes memory components, a drain select gate ("DSG") transistor, and a capacitor component. Each memory component, in one example, includes a source terminal, a gate terminal, a drain terminal, and a nonvolatile cell. The memory components are organized in a string formation and the components are interconnected between source terminals and drain terminals. The drain terminal of DSG transistor is coupled to the source terminal of a memory component and the gate terminal of DSG transistor is coupled to a DSG signal. The drain terminal of the capacitor is coupled to the source terminal of the first DSG transistor. The capacitor component is configured to perform a dynamic random-access memory ("DRAM") function.

22 Claims, 30 Drawing Sheets

Related U.S. Application Data

(60) Provisional application No. 62/068,693, filed on Oct. 26, 2014, provisional application No. 62/424,614, filed on Oct. 16, 2015, provisional application No. 62/137,242, filed on Mar. 24, 2015, provisional application No. 62/046,902, filed on Sep. 6, 2014.

(51) Int. Cl.
| | | |
|---|---|---|
| *G11C 16/10* | (2006.01) | |
| *H01L 27/1157* | (2017.01) | |
| *G11C 5/02* | (2006.01) | |
| *G11C 11/401* | (2006.01) | |
| *H01L 27/11582* | (2017.01) | |

(52) U.S. Cl.
CPC .......... *G11C 16/0483* (2013.01); *G11C 16/10* (2013.01); *H01L 27/1157* (2013.01); *H01L 27/11582* (2013.01)

(58) Field of Classification Search
USPC .................................................. 365/185.17
See application file for complete search history.

(56) References Cited

U.S. PATENT DOCUMENTS

| | | |
|---|---|---|
| 8,581,349 B1 | 11/2013 | Sekar et al. |
| 2005/0184329 A1 | 8/2005 | Prall |
| 2007/0076480 A1 | 4/2007 | Lee et al. |
| 2008/0087923 A1 | 4/2008 | Son et al. |
| 2009/0026524 A1* | 1/2009 | Kreupl ................ H01L 21/8221 257/316 |
| 2011/0228603 A1* | 9/2011 | Takashima ............. G11C 14/00 365/185.08 |
| 2011/0267883 A1 | 11/2011 | Lee et al. |
| 2012/0248595 A1 | 10/2012 | Or-Bach et al. |

OTHER PUBLICATIONS

Written Opinion of the International Searching Authority, dated Feb. 12, 2016, for corresponding International Application No. PCT/US2015/057403.

* cited by examiner

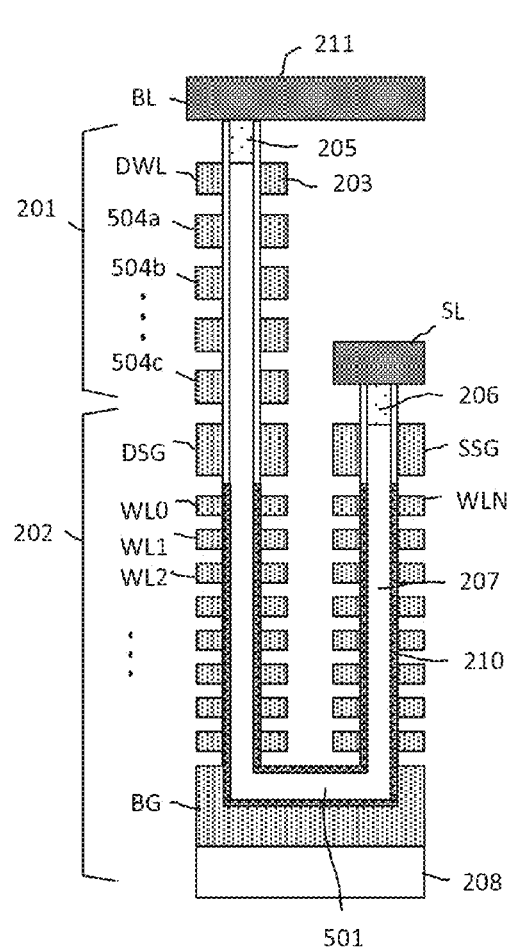
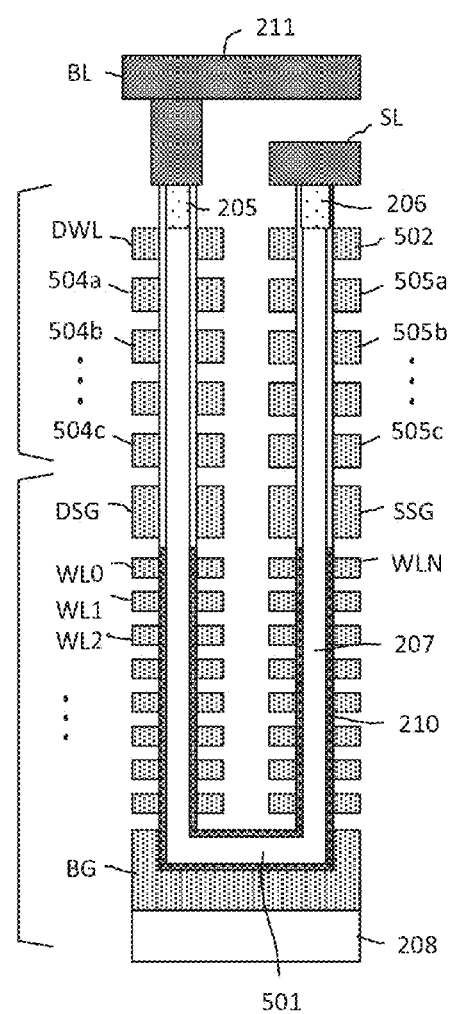
FIG. 5C
FIG. 5D

METHOD AND APPARATUS FOR PROVIDING THREE-DIMENSIONAL INTEGRATED NONVOLATILE MEMORY (NVM) AND DYNAMIC RANDOM ACCESS MEMORY (DRAM) MEMORY DEVICE

PRIORITY

This application claims the benefit of priority based upon U.S. Provisional Patent Application Ser. No. 62/242,614, filed on Oct. 16, 2015, and entitled "3D NAND and DRAM Integrated Flash Memory;" U.S. Provisional Patent Application Ser. No. 62/068,693, filed on Oct. 26, 2014 and entitled "2D and 3D NAND Flash Memories with Multi-page Read and Write," and U.S. Provisional Patent Application Ser. No. 62/137,242, filed on Mar. 24, 2015 and entitled "3D NAND and DRAM Integrated Flash Memory," all of which are hereby incorporated herein by reference in their entireties; and This application is a continuation-in-part (CIP) application of co-pending U.S. patent application Ser. No. 14/846,673, entitled "Method and Apparatus for Writing Nonvolatile Memory Using Multiple-Page Programming," filed on Sep. 4, 2015, which further claims the benefit of priority based on U.S. Provisional Patent Application Ser. No. 62/046,902, filed on Sep. 6, 2014, entitled "NAND flash memory with multiple-page programming," all of which are hereby incorporated herein by reference in their entireties.

CROSS-REFERENCE TO RELATED APPLICATION

The present application contains subject matter that may be related to the subject matter in U.S. application Ser. No. 14/864,741 entitled: "Method and Apparatus for Storing Information Using a Memory Able to Perform Both NVM and DRAM functions", filed on Sep. 24, 2015, and assigned to the assignee of the present invention.

FIELD OF THE INVENTION

The exemplary embodiment(s) of the present invention relates to the field of semiconductor and integrated circuits. More specifically, the exemplary embodiment(s) of the present invention relates to memory and storage devices.

BACKGROUND OF THE INVENTION

Nonvolatile memory, such as NAND or NOR based flash memory, is widely used in today's technology world. Its unique cell and array structures provide small cell size, high density, low write current, and high throughout. Nonvolatile memory such as NAND based flash memory becomes major storage memory for various devices and systems, such as memory cards, USB flash drives, and solid-state drives. Some exemplary applications of flash memory include personal computers, PDAs, digital audio players, digital cameras, mobile phones, synthesizers, video games, scientific instrumentation, industrial robotics, and medical electronics.

With recent development of semiconductor processing technology, the transformation from two-dimensional ("2D") to three-dimensional ("3D") NAND flash memory becomes possible. A 3D NAND flash memory, for example, can reach 128 to 256 gigabit ("Gb") storage capacity. Although conventional 3D NAND flash memory technology, for example, may use 16 nanometers ("nm") technology, the typical speed for NAND flash memory is relatively slow in comparison with the speed for dynamic random-access memory ("DRAM") or static random-access memory ("SRAM").

A problem, however, associated with a typical 3D NAND based flash memory is data transfer between nonvolatile memory ("NVM") chip and random-access memory chip such as DRAM and/or SRAM. Since the conventional NVM and DRAM are fabricated in different dies, communication between NVM and DRAM via an external bus(s) typically hampers overall data transfer speed.

Another drawback associated with conventional NAND based flash memory is that it has a relatively slow programming speed. A reason for a slow programming speed and/or erasing speed is that a conventional NAND flash memory performs single-page programming. For some applications, a slow programming and/or erasing speed in a nonvolatile memory storage becomes a limitation.

SUMMARY

One embodiment of the present invention discloses a memory system capable of storing information using a hybrid volatile and nonvolatile memory device organized in a stacking configuration. The memory system, in one aspect, includes memory components, a drain select gate ("DSG") transistor, and a capacitor component. Each memory component, in one example, includes a source terminal, a gate terminal, a drain terminal, and a nonvolatile cell. The memory components are organized in a string formation and the components are interconnected between source terminals and drain terminals. The drain terminal of DSG transistor is coupled to the source terminal of a memory component and the gate terminal of DSG transistor is coupled to a DSG signal. The drain terminal of the capacitor is coupled to the source terminal of the first DSG transistor. The capacitor component is configured to perform a dynamic random-access memory ("DRAM") function.

Additional features and benefits of the present invention will become apparent from the detailed description, figures and claims set forth below.

BRIEF DESCRIPTION OF THE DRAWINGS

The exemplary embodiment(s) of the present invention will be understood more fully from the detailed description given below and from the accompanying drawings of various embodiments of the invention, which, however, should not be taken to limit the invention to the specific embodiments, but are for explanation and understanding only.

FIGS. 5A-F are block diagrams illustrating alternative aspects of physical layout showing in vertical orientation of 3D hybrid NVM/DRAM memory device in accordance with one embodiment of the present invention;

FIGS. 6A-F are 3D block diagrams showing aspects of physical layouts associated with 3D hybrid NVM/DRAM memory device in accordance with one embodiment of the present invention;

DETAILED DESCRIPTION

Figure 1A:
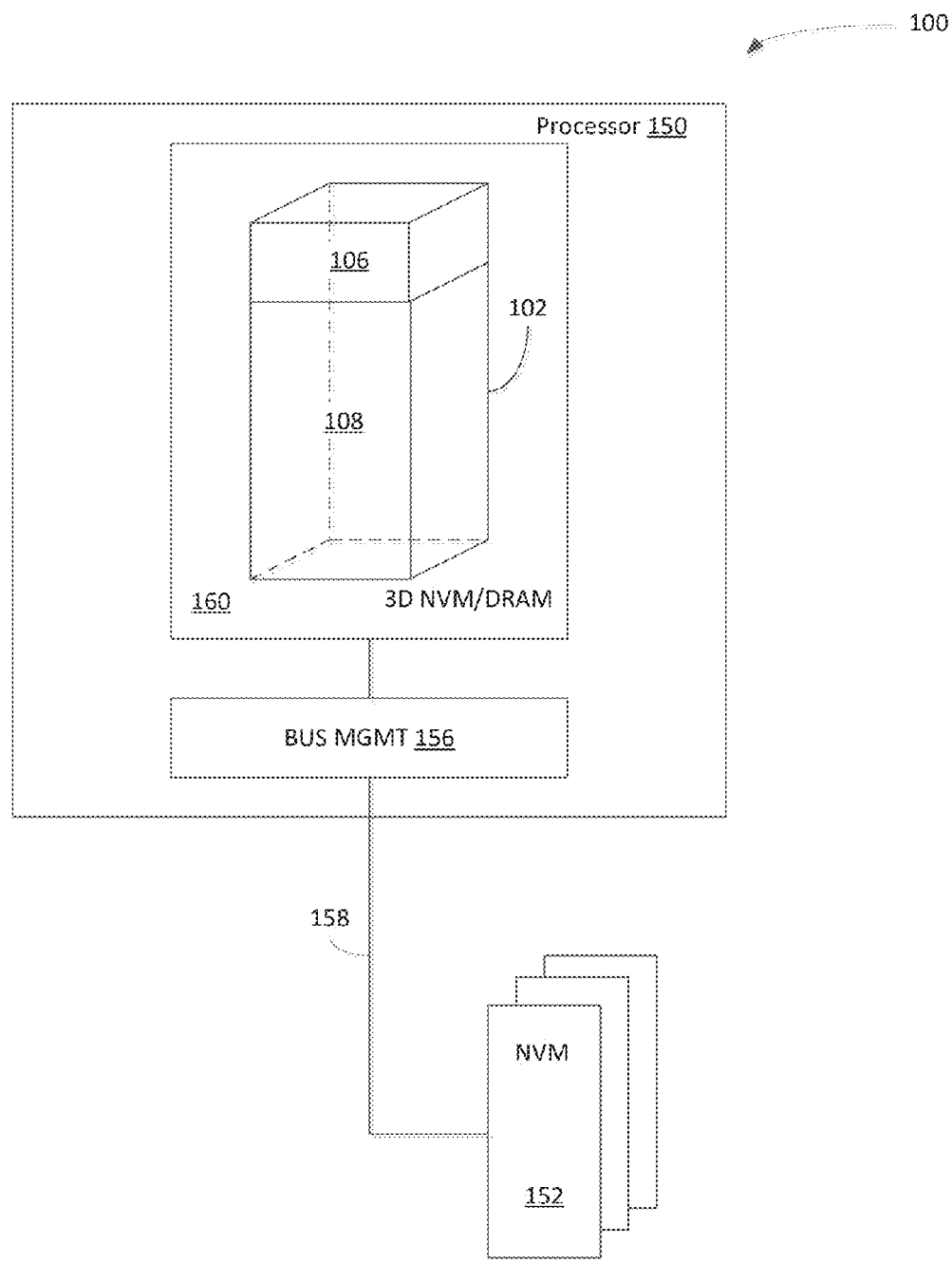
FIGS. 1A-B are block diagrams illustrating digital processing systems capable of storing data using three-dimensional ("3D") nonvolatile memory ("NVM") array and dynamic random access memory ("DRAM") in accordance with one embodiment of the present invention.

Exemplary embodiment(s) of the present invention is described herein in the context of a method, device, and apparatus for providing storage devices using both volatile and nonvolatile memory devices.

Those of ordinary skilled in the art will realize that the following detailed description of the present invention is illustrative only and is not intended to be in any way limiting. Other embodiments of the present invention will readily suggest themselves to such skilled persons having the benefit of this disclosure. Reference will now be made in detail to implementations of the exemplary embodiments of the present invention as illustrated in the accompanying drawings. The same reference indicators (or numbers) will be used throughout the drawings and the following detailed description to refer to the same or like parts.

In accordance with the embodiment(s) of present invention, the components, process steps, and/or data structures described herein may be implemented using various types of operating systems, computing platforms, computer programs, and/or general purpose machines. Where a method comprising a series of process steps is implemented by a computer or a machine and those process steps can be stored as a series of instructions readable by the machine, they may be stored on a tangible medium such as a computer memory device (e.g., ROM (Read Only Memory), PROM (Programmable Read Only Memory), EEPROM (Electrically Erasable Programmable Read Only Memory), FLASH Memory, Jump Drive, and the like), magnetic storage medium (e.g., tape, magnetic disk drive, and the like), optical storage medium (e.g., CD-ROM, DVD-ROM, paper card and paper tape, and the like) and other known types of program memory.

Those of ordinary skills in the art will now realize that the devices described herein may be formed on a conventional semiconductor substrate or they may as easily be formed as a thin film transistor (TFT) above the substrate, or in silicon on an insulator (SOI) such as glass (SOG), sapphire (SOS), or other substrates as known to those of ordinary skills in the art. Such persons of ordinary skills in the art will now also realize that a range of doping concentrations around those described above will also work. Essentially, any process capable of forming pFETs and nFETs will work. Doped regions may be diffusions or they may be implanted.

The term "system" is used generically herein to describe any number of components, elements, sub-systems, devices, packet switch elements, packet switches, routers, networks, computer and/or communication devices or mechanisms, or combinations of components thereof. The term "computer" is used generically herein to describe any number of computers, including, but not limited to personal computers, embedded processors and systems, control logic, ASICs, chips, workstations, mainframes, etc. The term "device" is used generically herein to describe any type of mechanism, including a computer or system or component thereof. The terms "task" and "process" are used generically herein to describe any type of running program, including, but not limited to a computer process, task, thread, executing application, operating system, user process, device driver, native code, machine or other language, etc., and can be interactive and/or non-interactive, executing locally and/or remotely, executing in foreground and/or background, executing in the user and/or operating system address spaces, a routine of a library and/or standalone application, and is not limited to any particular memory partitioning technique. The steps, connections, and processing of signals and information illustrated in the figures, including, but not limited to the block and flow diagrams, are typically performed in a different serial or parallel ordering and/or by different components and/or over different connections in various embodiments in keeping within the scope and spirit of the invention.

One embodiment of the present invention discloses a memory system capable of storing information using a hybrid volatile and nonvolatile memory device organized in a stacking configuration. The memory system, in one aspect, includes memory components, a drain select gate ("DSG")

transistor, and a capacitor component. Each memory component, in one example, includes a source terminal, a gate terminal, a drain terminal, and a nonvolatile cell. The memory components are organized in a string formation and the components are interconnected between source terminals and drain terminals. The drain terminal of DSG transistor is coupled to the source terminal of a memory component and the gate terminal of DSG transistor is coupled to a DSG signal. The drain terminal of the capacitor is coupled to the source terminal of the first DSG transistor. The capacitor component is configured to perform a dynamic random-access memory ("DRAM") function.

FIG. 1A is a block diagram 100 illustrating a digital processing system capable of storing data using three-dimensional ("3D") nonvolatile memory ("NVM") array and dynamic random access memory ("DRAM") in accordance with one embodiment of the present invention. Diagram 100, in one embodiment, includes a processor 150, NVM storage 152, and a bus 158. Processor 150 further includes an on-chip memory 160 and a bus manager 156 wherein on-chip memory 160 further includes a 3D dual function storage 102 that is capable of performing DRAM function and/or NVM function based on mode selections. In one embodiment, storage 102 is a 3D hybrid NVM and DRAM ("NVM/DRAM") memory device wherein 3D NVM 108 is situated in one section of storage 102 while 3D DRAM 106 is situated in another section of storage 102. In one example, DRAM 106 couples to NVM 108 for data storage as well as emergency backup. NVM, in one aspect, can be NAND based flash memory, NOR based flashed memory, floating gate cells, charge-trapping cells, SONOS cells, PMOS cells, split-gate cells, phase-changing memory ("PCM"), EEPROM (erasable programmable read-only memory), or a combination of NAND, NOR, PCM, and/or EEPROM memory. To simplify forgoing discussion, NAND based flash memory is used as an exemplary NVM throughout the specification. It should be noted that the underlying concept of the exemplary embodiment(s) of the present invention would not change if one or more blocks (or devices) were added to or removed from diagram 100.

Storage 102 containing hybrid NVM cells 108 and DRAM cells 106 can be referred to as 3D hybrid NVM/DRAM or DRAM-NAND ("DNAND"). Note that DRAM cells and NAND cells are coupled with each other to enhance memory performance. In one aspect, DNAND cell has NAND-like cell structure that is similar to NAND cell wherein the DNAND cell can be used as NAND cell and DRAM cell based on operation mode. Although memory 160 is an embedded memory within a central processing unit ("CPU") 150, memory 160 can also be a stand-alone memory chip able to provide dual functions of NVM and DRAM.

Since 3D NVM/DRAM 102 uses similar NAND string(s) to provide both DRAM storage function as well as NAND flash memory function, 3D NVM/DRAM 102, in one aspect, is able to place both DRAM cells and NAND cells on a single chip or die. To build or fabricate DRAM compatible to NAND process, both NAND and DRAM cells can be manufactured in one chip or die. NAND array and DRAM array may also be embedded in a microcontroller or any other chip(s).

In operation, on-chip memory 160 is capable of facilitate data transfer between NVM/DRAM 102 and NVM 152 via bus 158. Bus manager 156 is capable of simultaneously transferring data between NVM/DRAM 102 of memory 160 and NVM 152. In another embodiment, on-chip memory 160 is able to backup data in DRAM 106 to NVM cells 108 during an emergency shutdown or power loss.

An advantage of employing on-chip memory 160 containing both DRAM and NVM is that it facilitates concurrent multiple-page NVM programming as well as multiple blocks erasing. In addition, on-chip memory 160 also improves overall data transfer speed between on-chip memory 160 and NVM 152 using 3D NVM/DRAM 102. Furthermore, another advantage of using on-chip memory 160 is that it can backup data from DRAM cells 106 to NVM cells 108 during an emergency time.

Figure 1B:
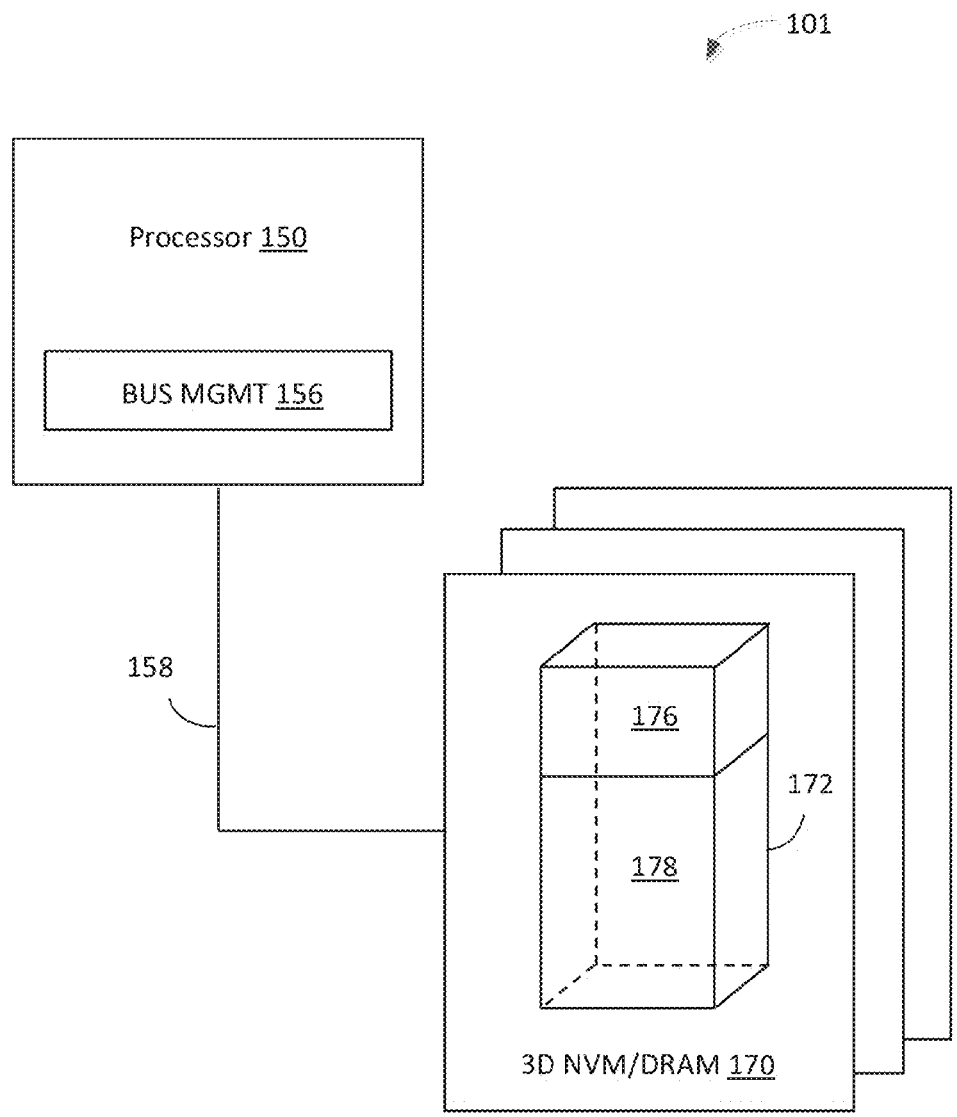

FIG. 1B is a block diagram 101 illustrating a digital processing system capable of storing data using a 3D hybrid NVM/DRAM memory device in accordance with one embodiment of the present invention. Diagram 101, in one embodiment, includes a processor 150, NVM storage 172, and a bus 158. NVM storage 172 further includes one or more 3D hybrid NVM/DRAM memory devices capable of performing DRAM functions as well as NVM functions. In one embodiment, hybrid NVM/DRAM memory devices 170 includes one or more 3D arrays 172 wherein each 3D array 172 includes a DRAM portion 176 and a NVM portion 178. In one example, DRAM portion 176 includes one or more DRAM cells capable of temporarily storing data. NVM portion 178 includes one or more NVM strings capable of persistently storing data. In one aspect, DRAM cells couple to NVM cells for data storage as well as emergency backup.

Figures 2A, 2B:
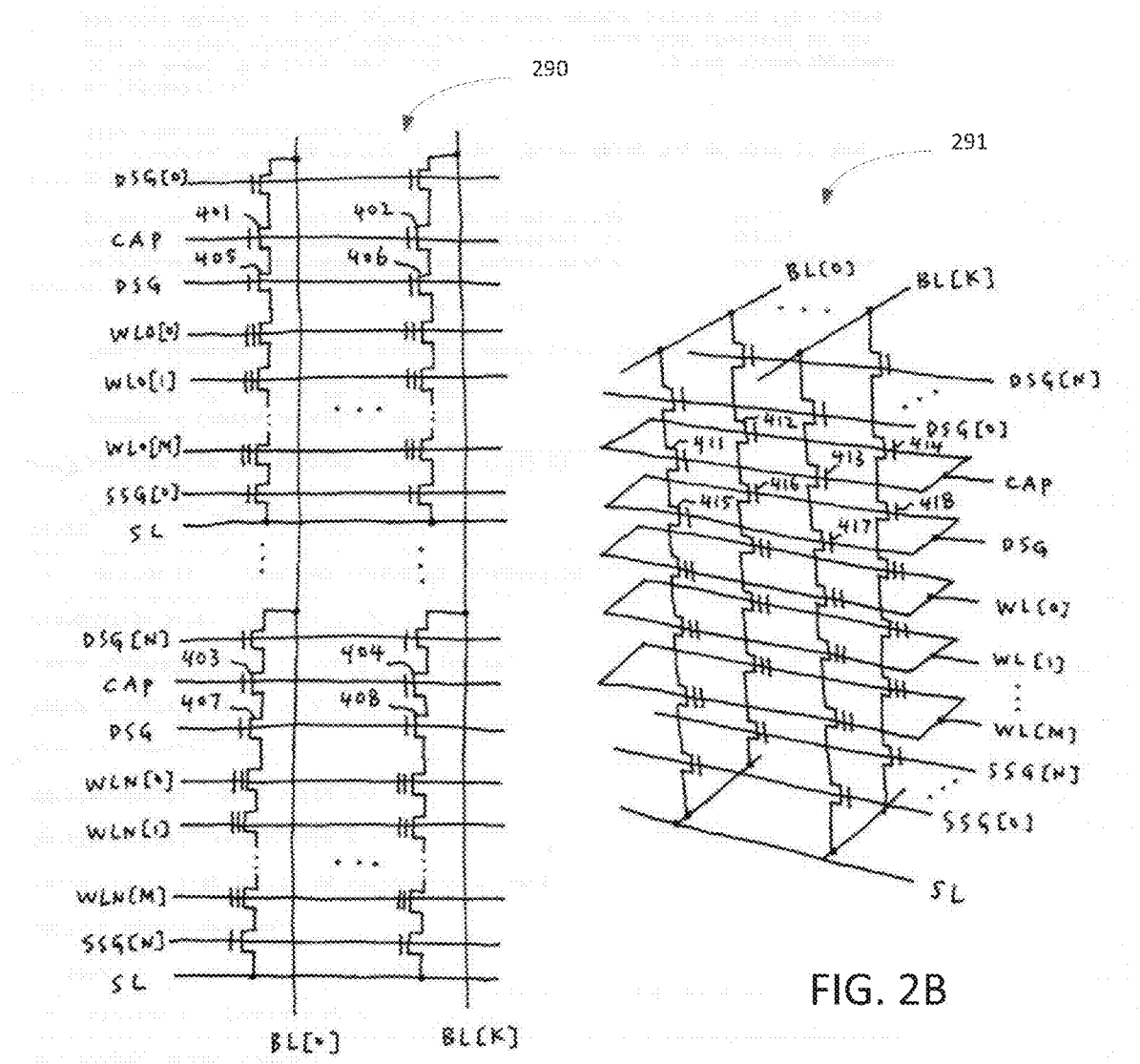
FIGS. 2A-B are schematic diagrams illustrating a hybrid NVM/DRAM memory device having multiple NVM strings organized in 3D configuration in accordance with one embodiment of the present invention.

FIGS. 2A-B are schematic diagrams 290-291 illustrating a hybrid NVM/DRAM memory device having multiple NVM strings organized in 3D configuration in accordance with one embodiment of the present invention. Diagram 290 shows an embodiment of 2D array according to one embodiment of the invention. The 2D array includes Metal Oxide Semiconductor ("MOS") capacitors 401-404 to the cell strings wherein MOS capacitors 401-404 are able to hold electric charge. In addition, a set of secondary drain select gates ("DSGs") 405-408 are added to the strings to manage DRAM operation and/or NVM operation. It should be noted that the underlying concept of the exemplary embodiment(s) of the present invention would not change if one or more blocks (or devices) were added to or removed from diagram 290.

In one embodiment, the hybrid NVM/DRAM memory device includes multiple memory components, a DSG transistor, and a capacitor component configured to store information. Each of the memory components has a source terminal, a gate terminal, a drain terminal, and a nonvolatile cell. The memory components are organized in a string interconnected between source terminals and drain terminals of the memory components. The string, in one example, is referred to as NAND based NVM string, NAND string, NAND cells, NVM cells string, or the like.

The DSG transistor has a source terminal, a drain terminal, and a gate terminal wherein the drain terminal of the DSG transistor is coupled to the source terminal of the memory components. The gate terminal of the DSG transistor is coupled to a first DSG signal used to control the logic state of DSG transistor. The hybrid NVM/DRAM memory device further includes a SSG wherein the source terminal of the SSG component is coupled to a drain terminal of one of the memory components organized in a string.

The capacitor component, in one aspect, includes a source terminal, a drain terminal, and a gate terminal wherein the drain terminal of the capacitor is coupled to the source terminal of the DSG transistor. The capacitor component is capable of performing a DRAM function. In one aspect, the hybrid NVM/DRAM memory device further includes a second DSG transistor wherein the draining terminal of the second DSG transistor is coupled to the source terminal of the capacitor component. The capacitor component can be any types of semiconductor capacitor, such as MOS capacitor, PIP (Polysilicon-Insulator-Polysilicon) capacitor, stack capacitor, cylindrical capacitor, and the like.

FIG. 2B shows a diagram 291, which is similar to diagram 290, except that diagram 291 illustrates a 3D NVM/DRAM array architecture using 3D layout technology. In one example, MOS capacitors ("CAP") 411-414 are used to hold electric charge. Also, a set of secondary DSGs 415-418 are added to manage DRAM operation and/or NVM operation. In these array architectures, the data for each page is stored in MOS capacitors 411-414, and then programmed to the selected cells. MOS capacitor gates 411-414 are connected to a proper capacitor voltage, such as VDD or other voltages able to turn on MOS transistors 411-414.

An advantage of using 3D NVM/DRAM memory device is that the device is able to perform multi-page read operation and multi-page write operation.

Figure 2C:
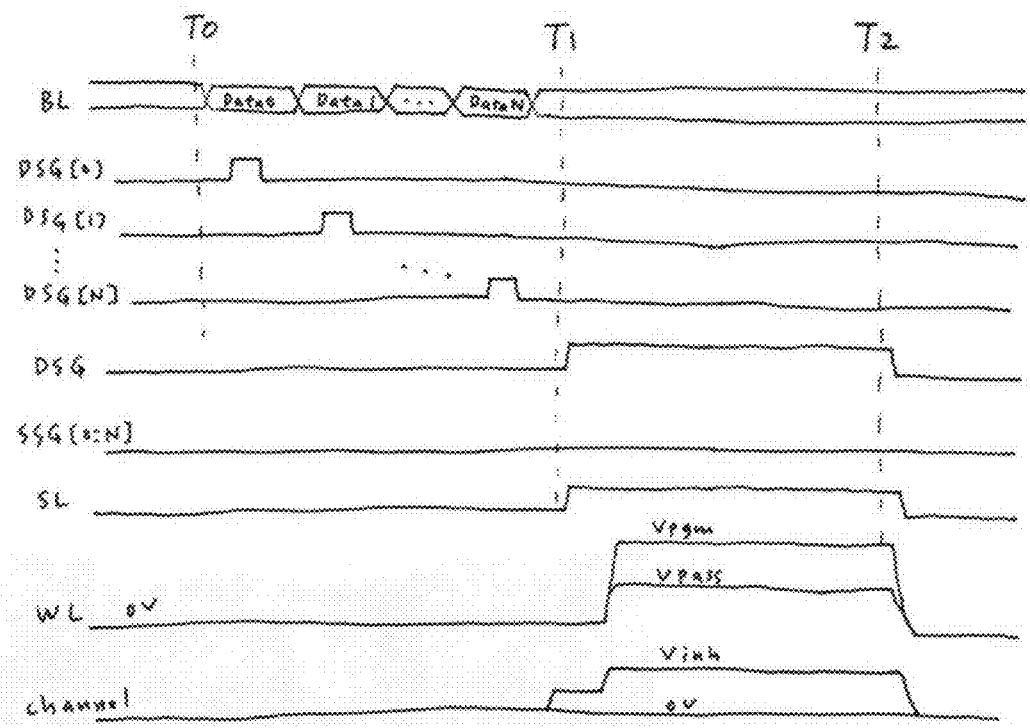
FIG. 2C is a timing diagram illustrating waveforms associated with various gate signals to manage 3D NVM and DRAM ("NVM/DRAM") storage configurations in accordance with one embodiment of the present invention.

FIG. 2C is a timing diagram 292 illustrating waveforms associated with various gate signals to manage 3D NVM/DRAM storage configurations in accordance with one embodiment of the present invention. Timing diagram 292 shows program waveforms for the 3D NVM/DRAM array architectures shown in FIG. 2A or 2B. At T0, BLs (bit lines) are applied with the data for each page, and DSG[0]-DSG[N] are applied with VDD pulses to load the data to the MOS capacitors page by page. After loading to the MOS capacitors, the DSG, at T1, is applied with VDD to turn on the secondary DSGs to load the data from the MOS capacitors to the cell strings. The WLs are applied with the Vpgm and Vpass for programming. At T2, the WLs' voltages are discharged and the program pulse is completed.

According to one embodiment of the present invention, the 2D and 3D array architectures shown in FIGS. 2A-B can perform multi-block erase operation. There are at least three approaches to perform the erase operation. The first approach is to apply a high voltage, Vers, such as 18V to 20V to the P-well of the cells. The selected multiple blocks' WLs are applied with 0V which will cause electrons to be injected from a floating gate to a channel region by Fowler-Nordheim tunneling effect for decreasing cells' Vt (threshold voltage). Meanwhile, the unselected blocks' WLs are floating causing WLs being coupled to 18-20V via P-well which inhibits the unselected cells from erasing.

The second approach is to locate the cells in multiple P-wells such as one block in one P-well. During the erasing operation, the selected multiple blocks P-wells are applied with Vers (erase voltage such as 18-20V) while WLs are applied with 0V to erase the cells. The unselected blocks' P-wells and WLs are applied with 0V to inhibit the erasing operation.

The third approach is to require negative WL voltages. The selected multiple blocks' WLs are applied with negative high voltages such as −18V to −20V. The P-well is applied with 0V which will cause electrons to inject from the floating gate to the channel region to erase the cells. The unselected blocks' WLs are applied with 0V to inhibit the erasing.

It should be noted that the NVM cells in the 3D NVM/DRAM memory device can be any type of NVM cells, including, but not limited to, NAND flash memory, Floating Gate (FG) cells, Charge-trapping cells such as SONOS (Silicon-Oxide-Nitride-Oxide-Silicon) cells, PMOS cells, Split-Gate cells, and the like.

Figure 3A:
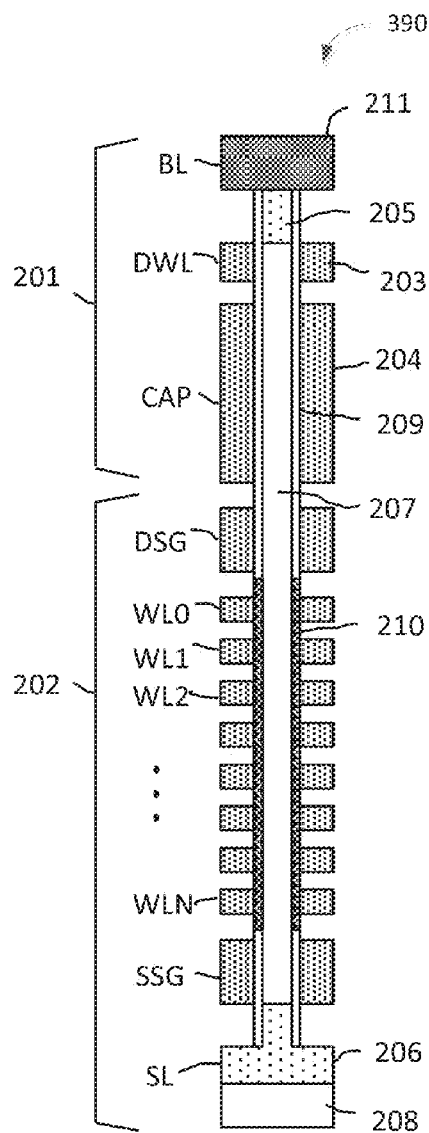
FIGS. 3A-D are block diagrams showing vertical orientations of 3D physical layout associated with 3D hybrid NVM/DRAM memory device in accordance with one embodiment of the present invention.

FIG. 3A is a block diagram 390 illustrating a vertical orientation of 3D physical layout associated with 3D hybrid NVM/DRAM memory device in accordance with one embodiment of the present invention. Diagram 390 illustrates a hybrid NVM and DRAM layout wherein a DRAM cell 201 is stacked on top of 3D NAND string 202. In an alternative embodiment, 3D NAND based NVM string 202 is extended to include DRAM cell 201 wherein both NVM string 202 and DRAM cell 201 are integrated into a channel or polysilicon channel 207. It should be noted that the underlying concept of the exemplary embodiment(s) of the present invention would not change if one or more blocks (or devices) were added to or removed from diagram 390.

DRAM cell 201 contains a select transistor 203 and a MOS capacitor 204 wherein select transistor 203 is connected to DRAM Word Line ("DWL") while MOS capacitor 204 is connected to capacitor ("CAP") voltage. The CAP voltage is normally a positive voltage for NMOS and a negative voltage for PMOS wherein a function of CAP voltage is to turn on the channel region of MOS capacitor 204. In one aspect, DRAM cell 201 includes multiple capacitors to enhance random-access storage capacity.

3D NAND string 202, which can also be referred to as 3D NAND based NVM string, is a 3D NAND flash memory's cell string. NAND string 202 includes DSG, SSG, and multiple cells connected in series WL0-WLN. The select gates such as DSG or SSG, in one example, have longer channel length partially due to the requirement of turning off one or more program high voltages. Note that NVM cells are placed in a side-way orientation capable of stacking one NVM cell on top of another NVM cell. In one aspect, NAND string 202 can contain a range of cells between 8 to 128 NVM cells. NAND string 202 and DRAM cell 201 are coupled via channel 207.

Channel 207, which can be a polysilicon channel, includes two diffusion regions 205-206. Diffusion regions 205-206 can be created or formed by N-type doping process which can also be referred to as an NMOS transistor. Alternatively, diffusion regions are created with P-type doping process which is generally referred to as a PMOS transistor. Channel 207 is formed or fabricated by silicon or polysilicon. In one example, channel 207 is not doped or lightly doped with dopants having opposite type of dopants or doping agents used in diffusion regions 205-206. Channel 207, in one aspect, is formed with gate oxide or high-K dielectric material 209. Alternatively, an ONO (Oxide-Nitride-Oxide) layer or any other type of charge-trapping layer 210 is used to store electrical charge such as electrons or holes to represent cells data. Substrate 208 can be P-SUB for NMOS or N-well for PMOS wherein channel 207 is established having an orientation substantially perpendicular to substrate 208. Metal layer 211 is used to receive or forward data via bit line ("BL").

Figure 3B:
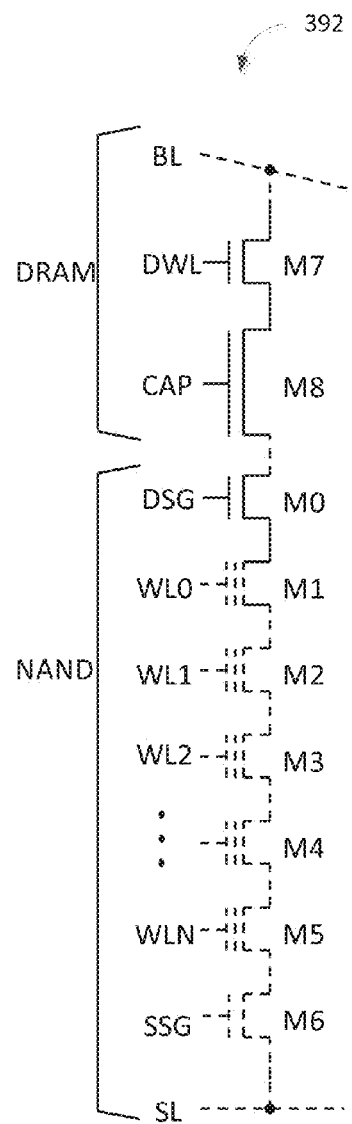

FIG. 3B is a schematic diagram 392 which shows substantially equivalent circuit(s) of the 3D DRAM and NAND cells string illustrated in FIG. 3A. Diagram 392 includes transistors or elements M7-M8 which are used for the DRAM cell. Also, NVM cells or transistors M0-M6 are used to establish the 3D NAND string.

An advantage of using a hybrid NVM/DRAM memory device is that it integrates 3D NVM cell string with DRAM cell on the same chip to improve overall data throughput for high speed applications. For nonvolatile storage, the DRAM cells data, for example, can be written to the selected page of the 3D NAND string. When a system requests the data stored in the NAND NVM string, the data can be read from a selected page of NVM cells to DRAM cells. Since read/write operations between DRAM and NAND cells can be performed to multiple memory strings simultaneously, the hybrid NVM/DRAM memory device can achieve high-speed read and write operations.

Figures 3C, 3D:
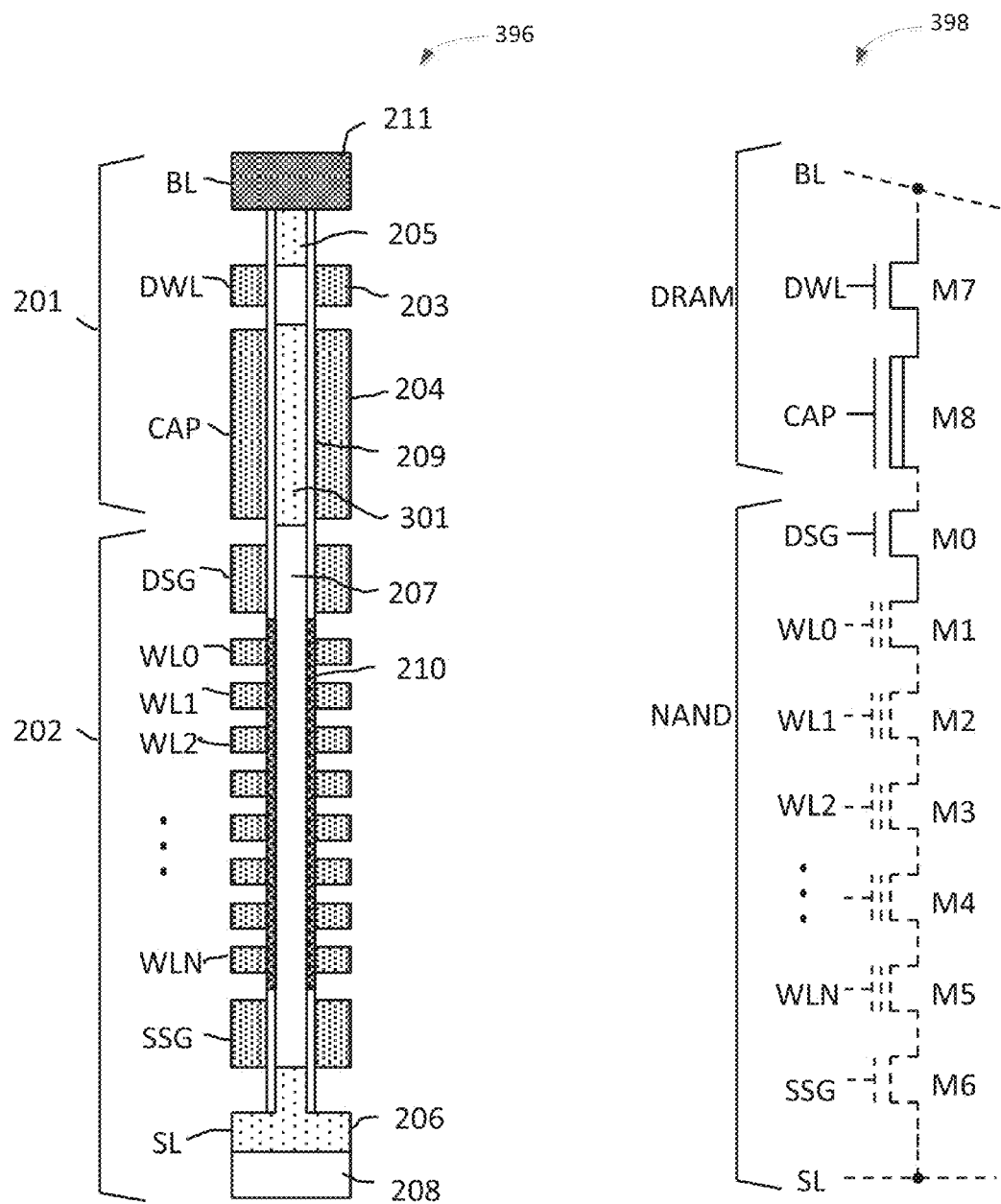

FIGS. 3C-D are block diagrams 396-398 showing a vertical orientation of 3D physical layout associated with 3D NVM/DRAM in accordance with one embodiment of the present invention. Diagram 396, which illustrates a 3D layout similar to the 3D layout illustrated in diagram 390 shown in FIG. 3A except that MOS capacitor's channel region 301 is doped with an opposite type of doping agent used in the rest of channel 207. MOS capacitor's channel region 301 facilitates MOS capacitor 204 to become a depletion transistor whereby it does not require a gate voltage CAP to turn on channel region 301. FIG. 3D is a schematic diagram 398 illustrating an equivalent circuit(s) of cell string shown in FIG. 3A. It should be noted that MOS capacitor M8 is represented by a depletion transistor.

Figure 4A:
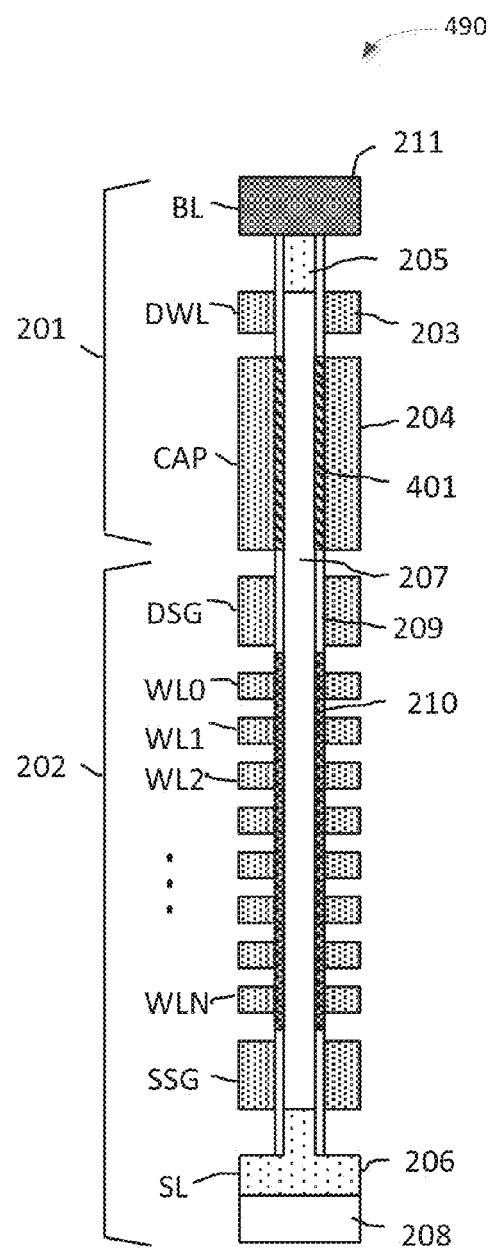
FIGS. 4A-F are block diagrams illustrating alternative aspects of physical layout showing vertical orientation of 3D hybrid NVM/DRAM memory device in accordance with one embodiment of the present invention.

FIG. 4A is a block diagram 490 illustrating alternative aspect of a physical layout showing vertical orientation of 3D NVM/DRAM memory device in accordance with one embodiment of the present invention. The memory device shown in diagram 490 is similar to the memory device shown in diagram 390 shown in FIG. 3A except that MOS capacitor 204 contains a high-K dielectric material layer 401 while the select gates such as DSG and SSG have gate oxide layer 209. The high-K dielectric material is similar to silicon dioxide wherein K refers to a material with a high dielectric constant K.

Figure 4B:
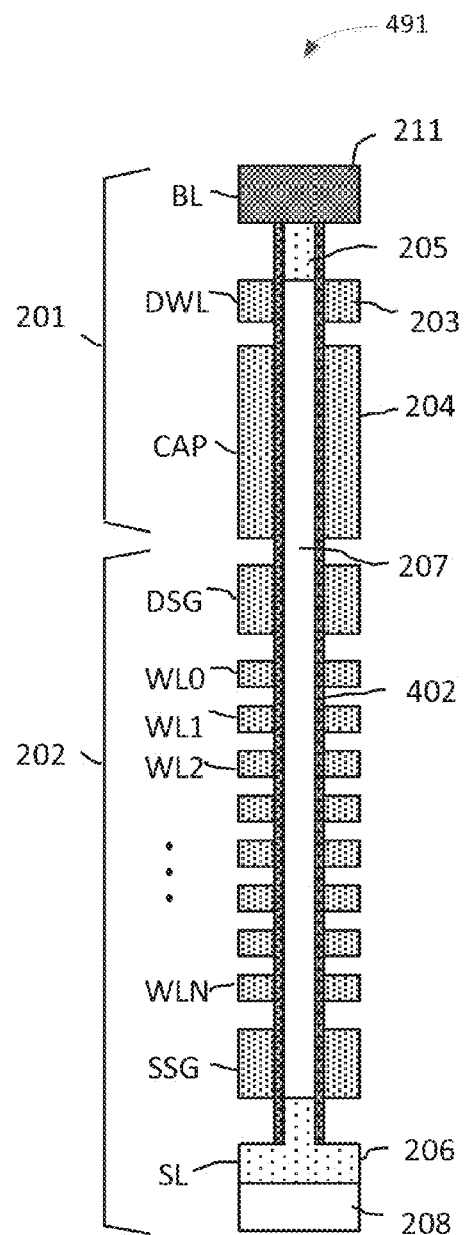

FIG. 4B is a block diagram 491 illustrating alternative aspect of a physical layout showing vertical orientation of 3D NVM/DRAM memory device in accordance with one embodiment of the present invention. The memory device shown in diagram 491 is similar to the memory device shown in diagram 390 shown in FIG. 3A except that the select gates, cells, and capacitor have the same or substantially the same ONO layer 402 used as the gate dielectric. A benefit of applying ONO layer 402 is that it simplifies overall fabrication process whereby manufacturing cost and resources can be reduced.

During an operation, the DSG and SSG of NAND string should gate or control voltage difference(s) between gate and channel to avoid unintended programming capacitor or NVM cell. For example, the voltage difference between gate and channel should not exceed predefined required voltage such as 10 Volts ("V") which may cause electron tunneling phenomena. It should be noted that operating voltage for DRAM cell is normally low whereby unintended cell program between NVM cell and capacitor should be low.

Figures 4C, 4D:
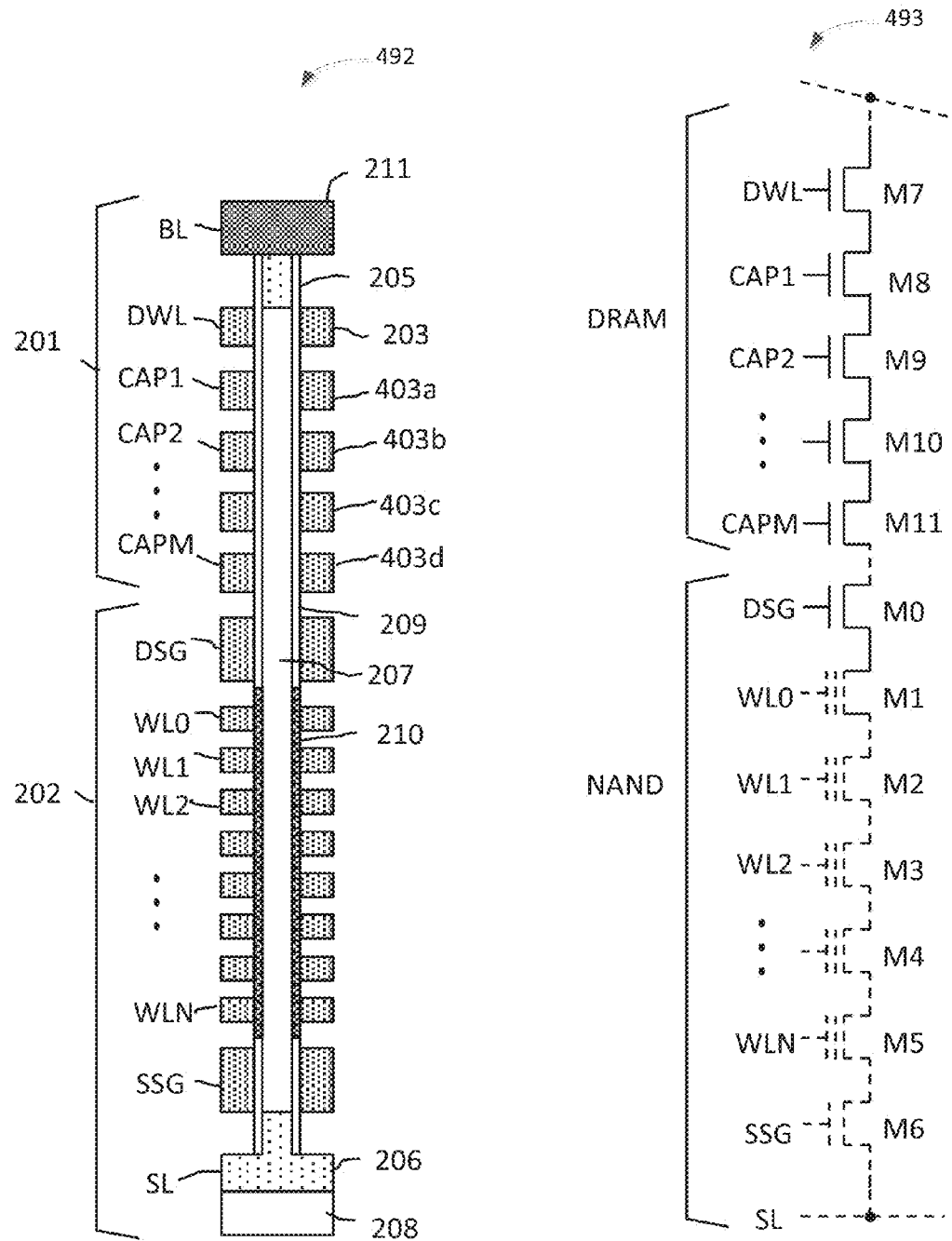

FIG. 4C is a block diagram 492 illustrating an alternative aspect of physical layout showing vertical orientation of 3D NVM/DRAM in accordance with one embodiment of the present invention. FIG. 4D illustrates a schematic diagram 493 showing an equivalent circuit of 3D NVM/DRAM cell structure shown in diagram 492 shown in FIG. 4C. The memory device shown in diagram 492 is similar to the memory device shown in diagram 390 shown in FIG. 3A except that the capacitance portion is divided into multiple capacitors 403a-403d. The gate terminals of capacitors 403a-403d are connected to different control signals CAP1, CAP2, and/or CAPM. The control signals CAP1, CAP2, and CAPM, in one example, may be connected to the same signal. Alternatively, the control signals CAP1, CAP2, and CAPM may be connect to different voltages to turn on and/or off the channel of the capacitors to alter or adjust the capacity of capacitance associated with capacitance portion such as capacitance element 201. An advantage of using multiple capacitors 403a-403d is that it uses the same process module to form the word lines for multiple capacitors.

Figures 4E, 4F:
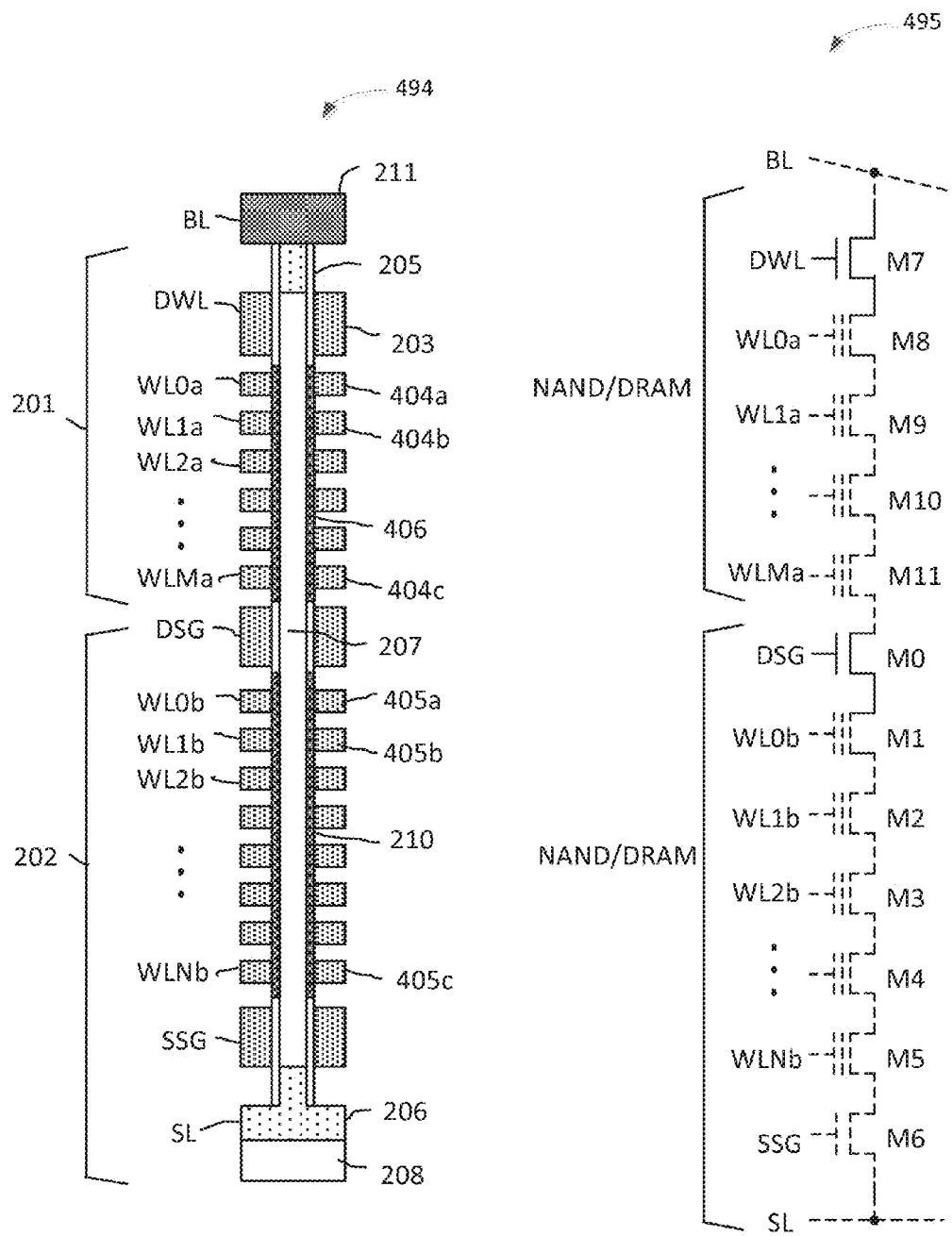

FIG. 4E is a block diagram 494 illustrating an alternative aspect of physical layout showing vertical orientation of 3D NVM/DRAM memory device in accordance with one embodiment of the present invention. FIG. 4F illustrates a schematic diagram 495 showing an equivalent circuit of 3D NVM/DRAM cell structure shown in diagram 494 shown in FIG. 4E. The memory device shown in diagram 494 is similar to the memory device shown in diagram 492 shown in FIG. 4C except that the multiple capacitors are replaced with multiple memory cells 404a-404c. In one aspect, channel 207 associated with DRAM cell 201 is applied with an ONO layer 406 or other type of charge-trapping layer to store cell data. Memory cells 404a-404c are connected to control signals or word lines such as WL0a, WL1a, and WLMa.

Memory cells 404a-404c, in one embodiment, can be operated in two operation modes. In one mode, the memory cells can be used to store data as the NAND flash memory cells. In another mode, the cells may be utilized as MOS capacitors to temporarily hold the data in the channels of the cells as DRAM cells. During DRAM operation mode, the data can be programmed to the selected word line of the NAND flash memory cells 405a-405c in NAND NVM string or bottom portion 202. Similarly, memory cells 405a-405c can also have two operation modes. In one mode, memory cells 405a-405c can be used as NAND flash memory cells. In another mode, memory cells 405a-405c can also be used as DRAM cells to hold data temporarily and subsequently program to the upper portion's NAND flash memory cells 404a-404c. In one aspect, DRAM select transistor ("DWL") 203 is configured to have longer channel length for handling higher voltage(s) during the program cycle of memory cells 404a-404c.

Figure 5A:
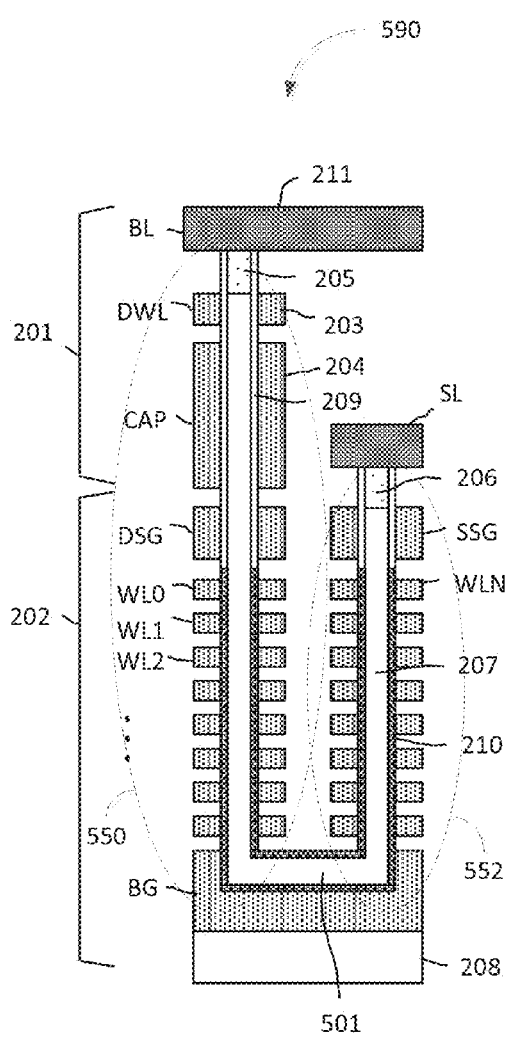

FIGS. 5A-F are block diagrams illustrating alternative aspects of physical layout showing in vertical orientation of 3D hybrid NVM/DRAM memory device in accordance with one embodiment of the present invention. FIG. 5A shows an embodiment of 3D NVM/DRAM cell structure 590 which is similar to the 3D NVM/DRAM cell structure shown in FIG. 3A except that the string is 'folded' into two adjacent vertical strings 550-552. Each of vertical strings 550-552 contains a portion or half of the NAND cells. In one aspect, vertical strings 550-552 are connected by channel 207 or a portion channel 501 ("pipe") wherein channel 207 is configured into a U-shaped string.

The bottom portion of the U-shaped string is pipe 501 which is situated on the back-gate ("BG"). BG, which is deposited on substrate 208, is used to turn on the channel of pipe 501. SL, in one embodiment, is connected to a metal layer. During a fabrication process, layers for vertical strings 550-552 are deposited over substrate 208 with NAND based NVM cells. After depositing select gates (i.e., DSG and SSG) over strings 550-552, the layers are subsequently etched to separate the two strings. After formation of NVM based strings, the process continues to deposit DRAM cell in the BL side. Upon completion of DRAM cell deposition, the process ends once BL and SL are applied.

Figure 5B:
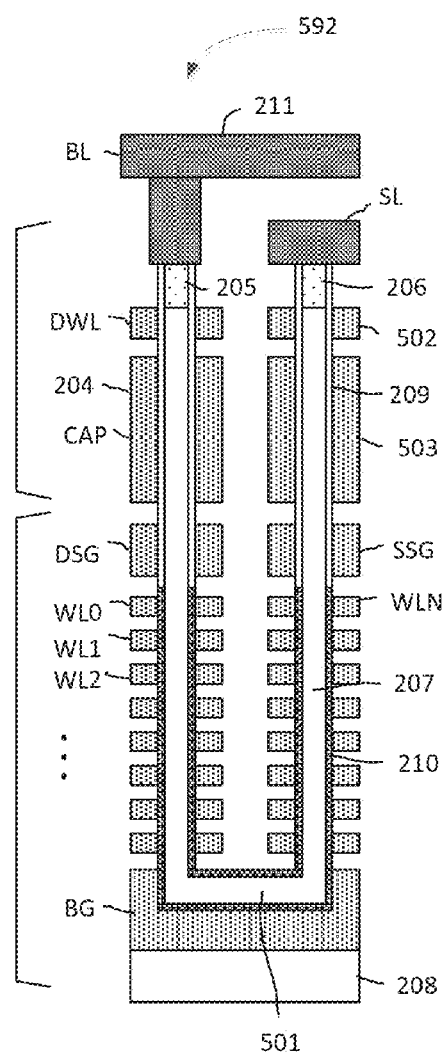

FIG. 5B illustrates a 3D NVM/DRAM cell structure 592 which is similar to the cell structure illustrated in FIG. 5A except the two strings have similar structure from the bottom up to the DRAM select gate. In one embodiment, 3D NVM/DRAM memory device includes an additional DRAM cell and select gate 502. The additional DRAM cell includes MOS capacitor 503 which is situated on the SL side. During operation, data can be stored in two DRAM cells. In another embodiment, DRAM cell can also be disabled. For example, the source side of DRAM cell may be disabled by activating select gate 502 and MOS capacitor 503 whereby the DRAM cell becomes a dummy device.

FIG. 5C shows a 3D NVM/DRAM cell structure which is similar to the cell structure shown in FIG. 5A except that a single capacitor is divided into multiple capacitors 504a-504c. FIG. 5D shows another 3D NVM/DRAM cell structure which is similar to the cell structure illustrated in FIG. 5B except that capacitors 204 and 503 are divided into multiple capacitors 504a-504c and 505a-505c, respectively.

Figure 5E:
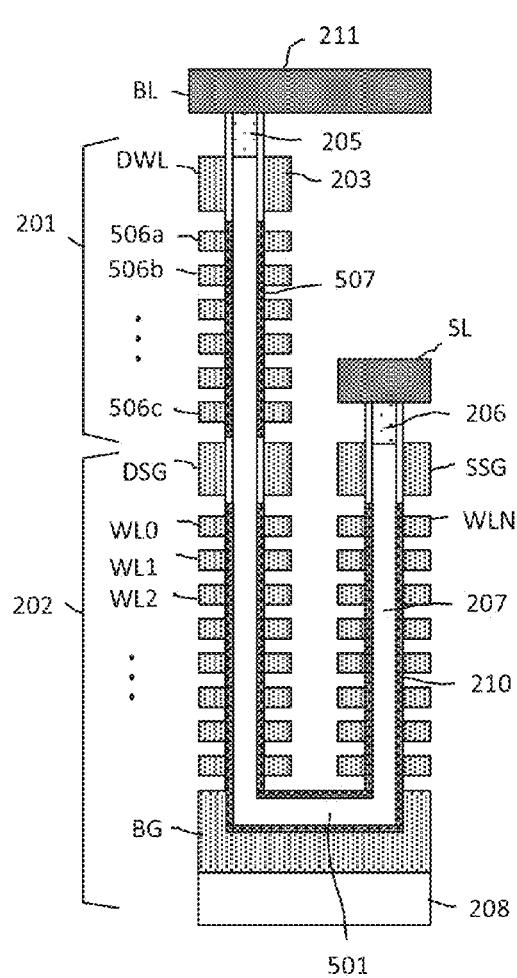

FIG. 5E shows a 3D NVM/DRAM cell structure which is similar to cell structure shown in FIG. 5C except that multiple capacitors 504a-504c are replaced by multiple NAND flash memory cells 506a-506c. In one embodiment, ONO layer 507 or any other type of charge-trapping layer is used to store or trap cell data. The cells, in one example, may have two operation modes, namely, NAND flash memory mode and DRAM mode.

Figure 5F:
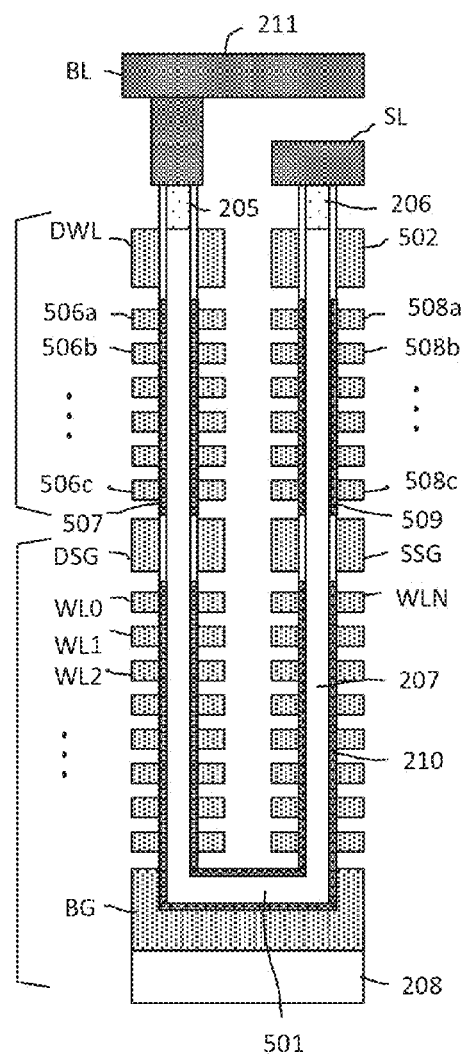

FIG. 5F shows a 3D NVM/DRAM cell structure which is similar to the cell structure shown in FIG. 5D except that multiple capacitors 504a-504c and 505a-505c are replaced with multiple NAND flash memory cells 506a-506c and 508a-508c, respectively. In one embodiment, ONO layer 507 and 509 or any other type of charge-trapping layer can be used to store cell data.

Figure 6A:
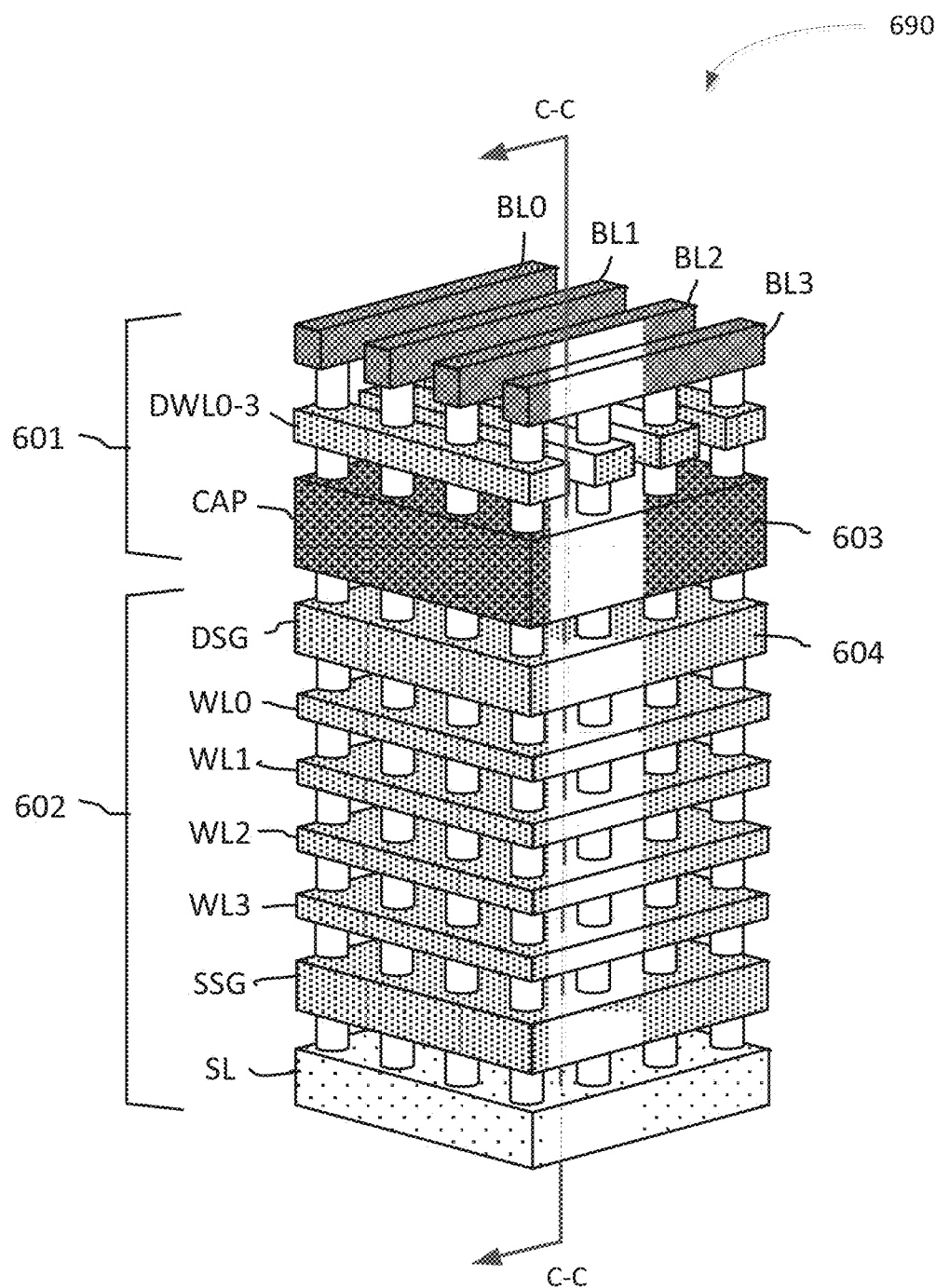

FIGS. 6A-F are 3D block diagrams showing aspects of physical layouts associated with 3D hybrid NVM/DRAM memory device in accordance with one embodiment of the present invention. FIG. 6A is an exemplary 3D hybrid NVM/DRAM memory device 690 wherein device 690 includes DRAM cell 601 and NAND cell string 602. To simplify the forgoing description, four (4) NAND based NVM cell with word lines WL0-3 are shown. In real products, each string may contain more than 32 NVM cells. Device 390 shown in FIG. 3A is a cross-view of device 690 cutting along axis C-C. In one embodiment, MOS capacitor 603 can be formed by the same material, such as polysilicon or metals, as other select gates and NVM cells. It should be noted that the NAND strings have a common drain select gate 604. During an operation, all DRAM cells' data can be written from or to the selected word line of the NAND strings when DSG 604 is activated.

Figure 6B:
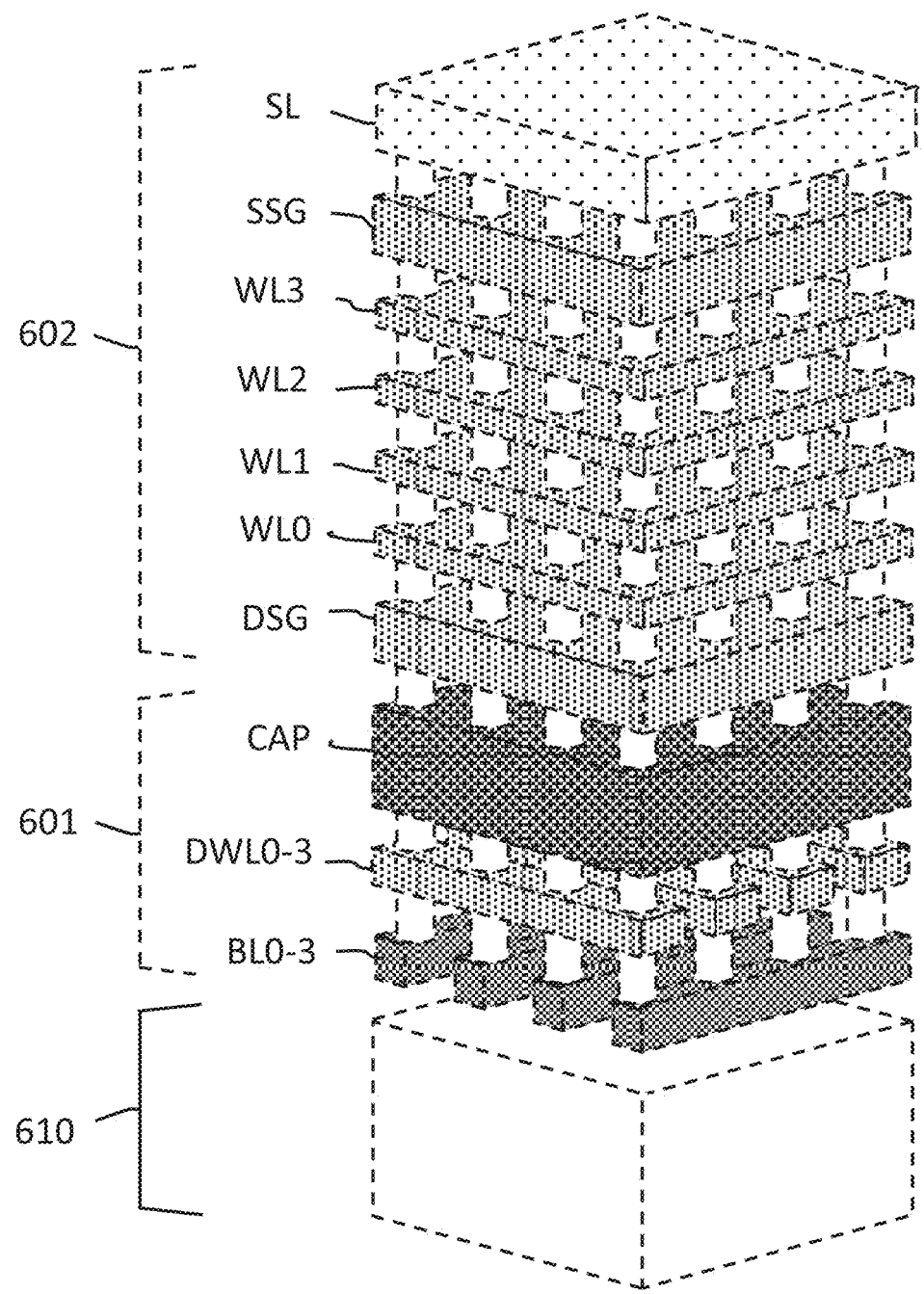

FIG. 6B illustrates an embodiment of the 3D array structure which is similar to the structure shown in FIG. 6A except that the array is formed in an up-side-down configuration. While DRAM cells 601 are located at the bottom of 3D array structure, NAND strings 602 are situated on the top of 3D array structure. One advantage of employing the up-side-down 3D array structure is that the entire array can be built or deposited on top of logic portion 610. Logic portion 610, such as microprocessor and buses, can read and write data to and from DRAM and DRAM can read and write data to and from NAND based NVM cells. The up-side-down 3D array structure is suitable for embedded and SOC (System-On-Chip) applications.

Figure 6C:
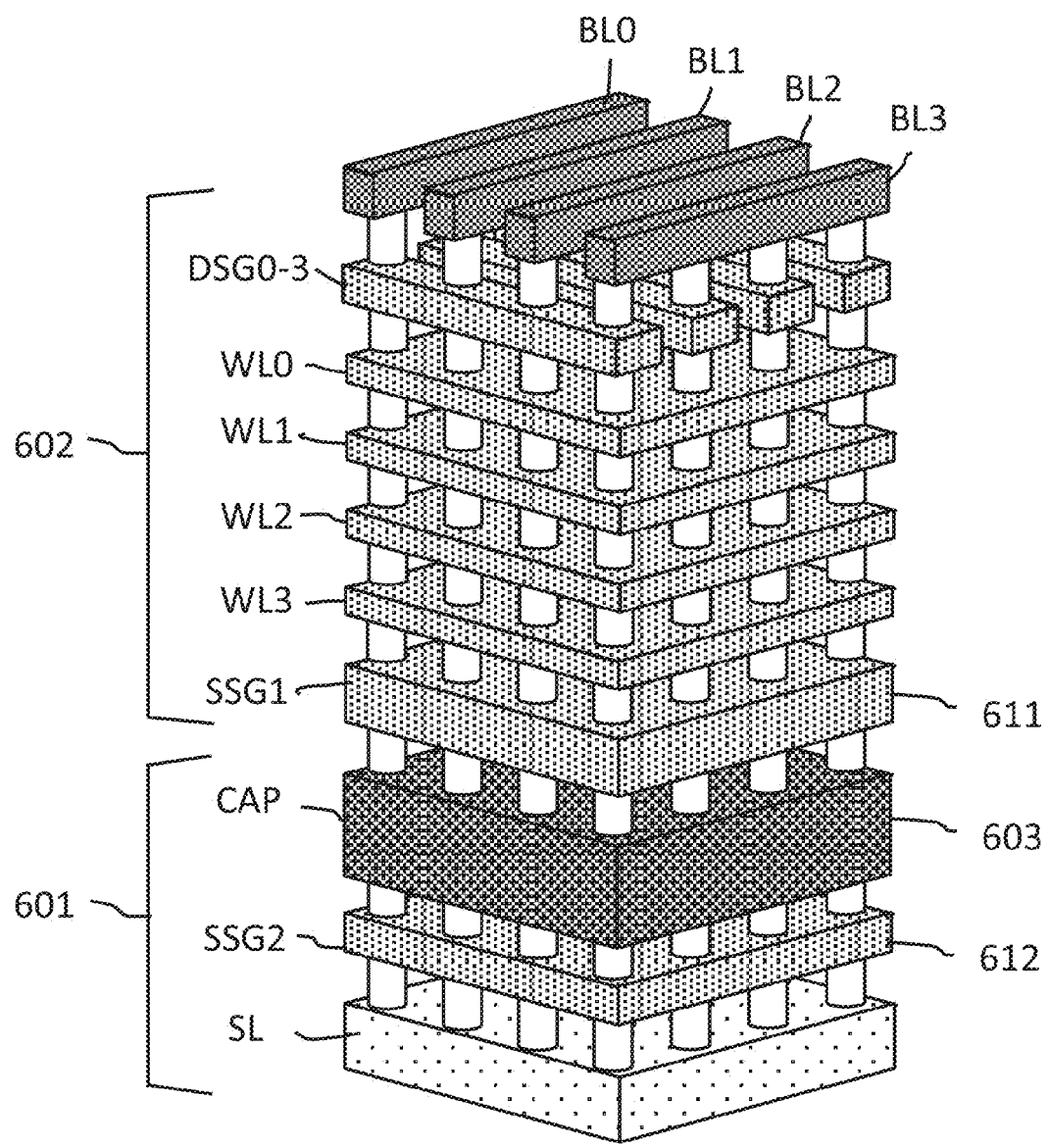

FIG. 6C shows an embodiment of 3D array structure wherein DRAM cells 601 are located at the SL side (or bottom) of NAND strings 602. MOS capacitor 603 is deposited over a second source select gate ("SSG 2") 612 which is disposed over SL. First source select gate ("SSG1") can be turned on to write data to DRAM cells according to values at BL0-3. SSG1 can also program data from DRAM cells to NVM cells based on selected WL0-3. SSG2 612 is used to turn on or off the connection between NAND strings and SL during a read operation. During a DRAM mode, after SSG2 612 is turned off, capacitor 603 is isolated from SL.

Figure 6D:
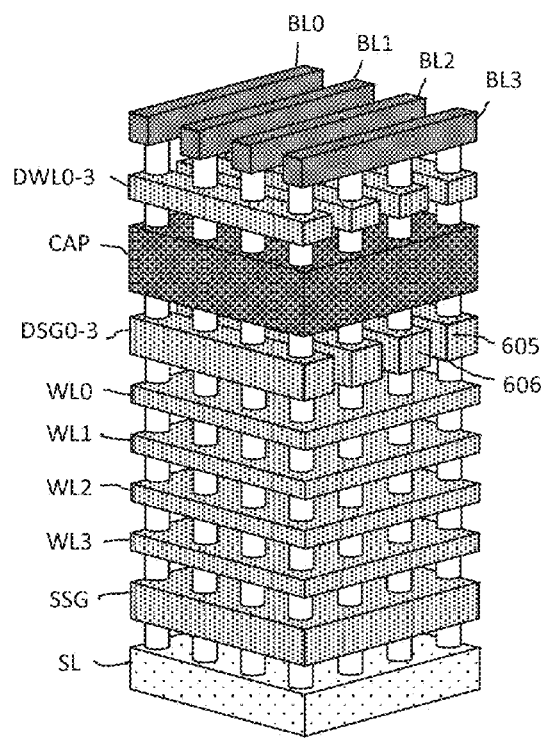
Figure 6E:
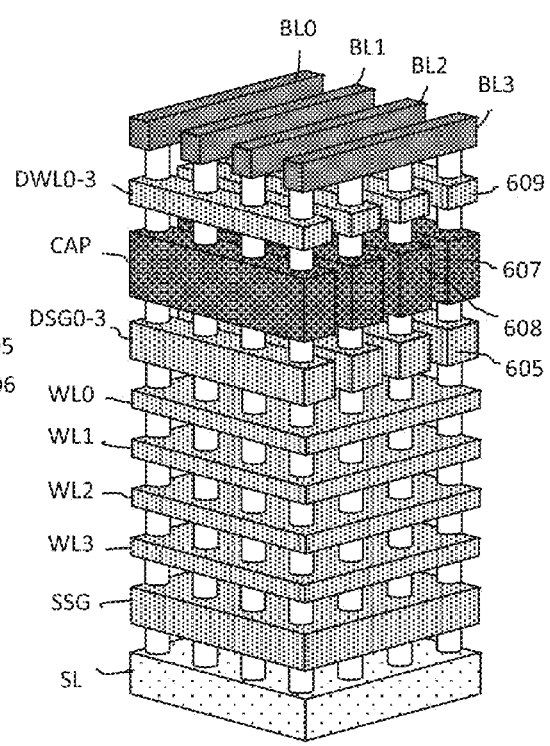

FIG. 6D shows an alternative embodiment of 3D array structure which is similar to the structure shown in FIG. 6A except that the NAND strings have independent DSGs 605-606. The select gates, for example, are connected to decoder's signals DSG0-3. The array structure is allowed to selectively read and/or write partial data from DRAM cells to NAND strings. FIG. 6E shows another embodiment of the 3D array structure which is similar to the structure shown in FIG. 6D except that it has separated MOS capacitors 607-608. The physical structure containing separated MOS capacitors 607-608 allows the patterns of DRAM select gates 609, MOS capacitors 607, and NAND's drain select gates 605 to be etched together in one process step. The separated capacitors may be connected to the same capacitor voltage CAP.

Figure 7A:
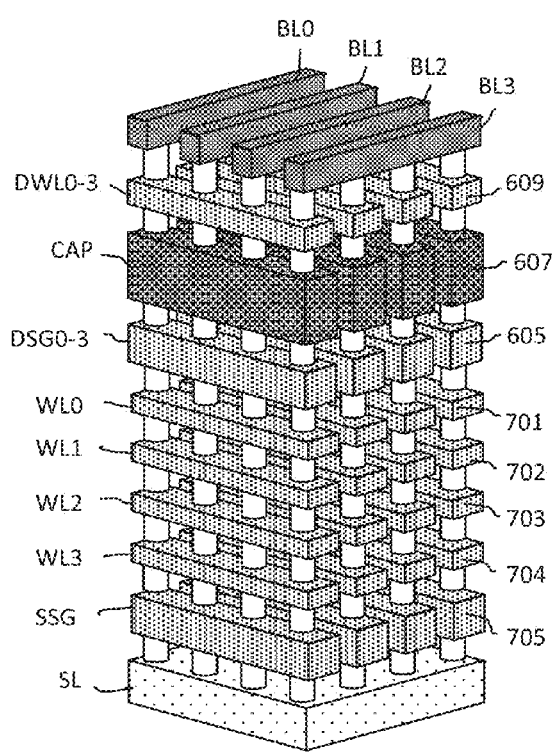
FIGS. 7A-B are 3D block diagrams showing physical layouts of 3D hybrid NVM/DRAM memory device using different string patterns in accordance with one embodiment of the present invention.
Figure 7B:
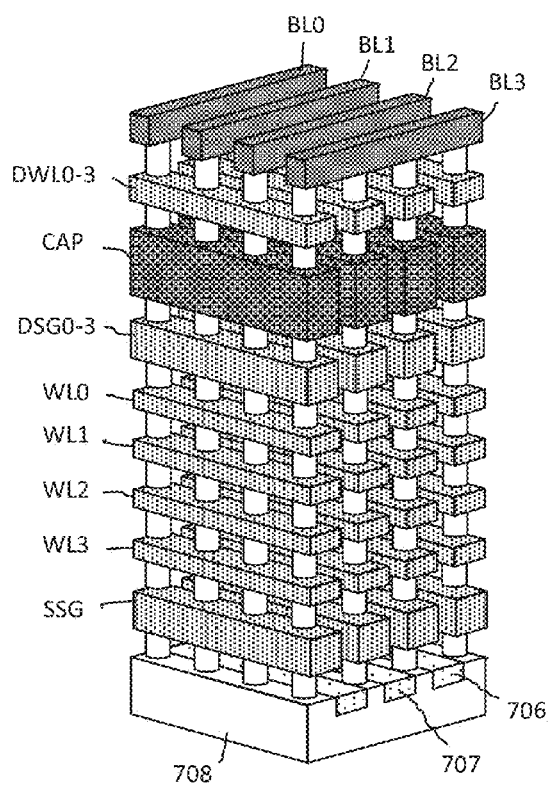

FIGS. 7A-B are 3D block diagrams showing physical layouts of 3D hybrid NVM/DRAM using different string patterns in accordance with one embodiment of the present invention. FIG. 7A shows 3D array structure which is similar to the structure shown in FIG. 6B except that NAND strings pattern are physically separated as indicated by numerals 605 and 701-705. Note that the hybrid NVM/DRAM device may be fabricated with some specific semiconductor processing procedures. Various etching process may be applied to form layer patterns from top to bottom wherein the substrate is situated at the bottom. The separated word lines and source select gates in the same level may be connected together outside the array. During a fabrication process, DRAM cell's select gates 609 and capacitors 607 can have different physical patterns from the patterns of NAND strings based on the applications. Depending on the applications, NAND strings and DRAM cells can have similar or substantially the same physical pattern. To produce NVM/DRAM device with similar physical patterns, layers from top to bottom except BL layer can be etched together in one process step.

FIG. 7B shows an embodiment of 3D array structure which is similar to the structure shown in FIG. 7A except that the source lines 706-707 are formed in substrate 708 instead of a SL layer. The source lines located in substrate or well 708 can be produced by some specific process. In one example, the source lines may be decoded or connected together.

Figure 8A:
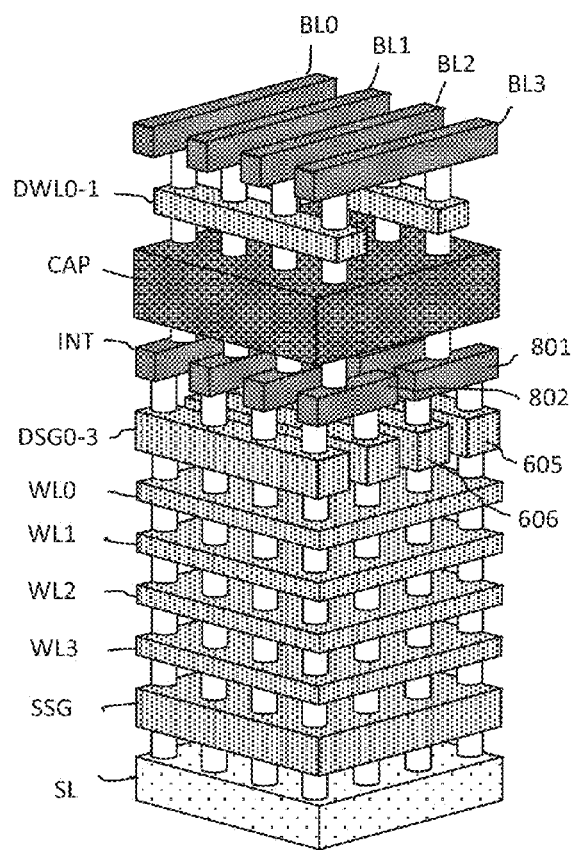
FIGS. 8A-C are 3D block diagrams showing physical layouts of 3D hybrid NVM/DRAM memory device using different configuration of DRAM word lines ("DWLs") in accordance with one embodiment of the present invention.
Figure 8B:
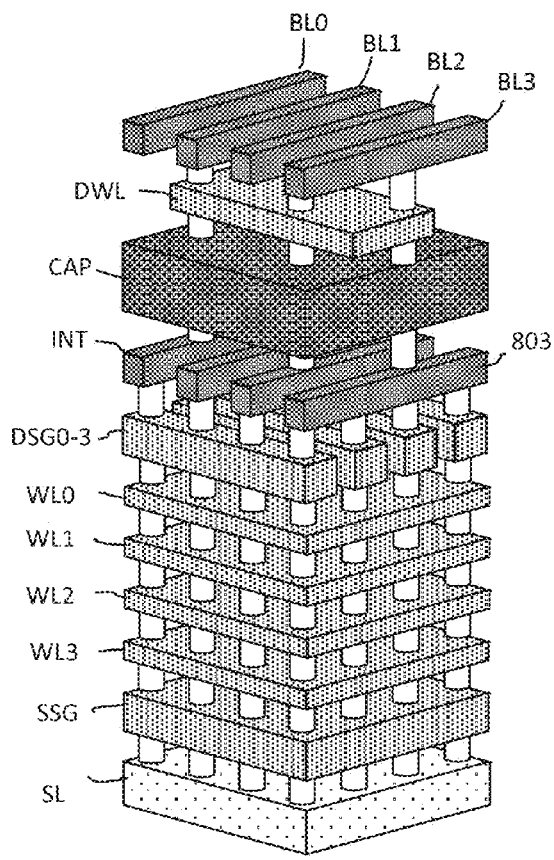
Figure 8C:
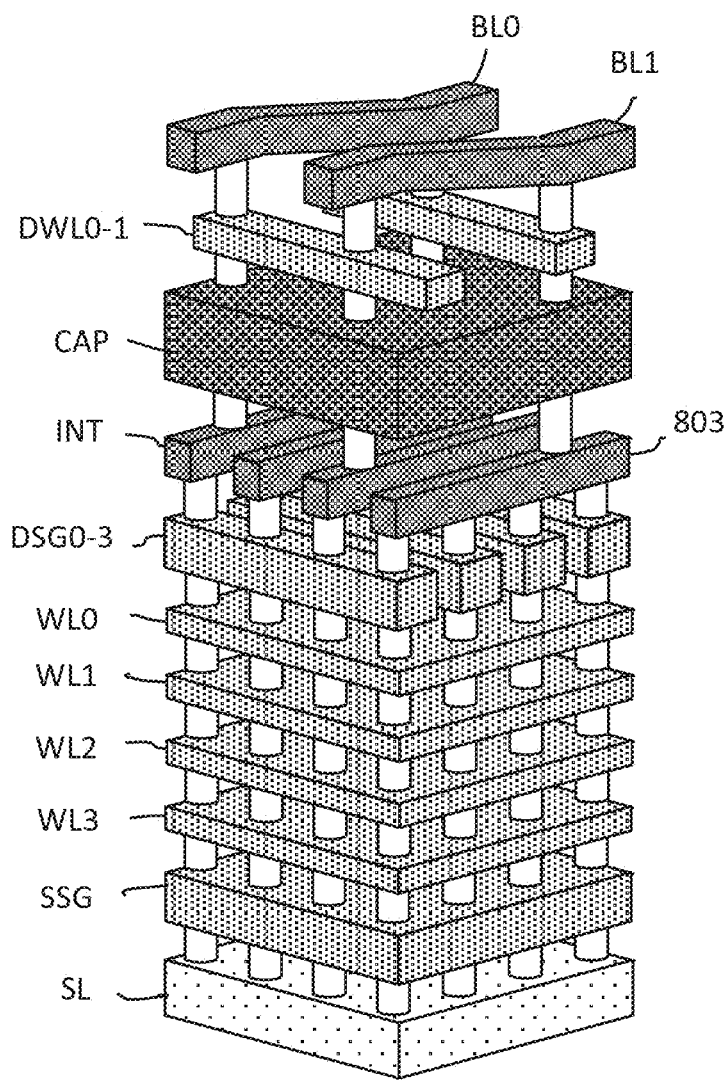

FIGS. 8A-C are 3D block diagrams showing physical layouts of 3D NVM/DRAM memory device using different configuration of DRAM word lines ("DWLs") in accordance with one embodiment of the present invention. FIG. 8A shows an embodiment of 3D hybrid NVM/DRAM array using an interconnection ("INT") layer. INT layers 801-802 are added between DRAM cell and NAND strings. The interconnection layer may be made of conductor materials such as polysilicon or metals which allow a DRAM cell to connect to multiple NAND strings. A benefit to use INT layers 801-802 is to reduce the number of DRAM cells. After the interconnection layer connects a DRAM cell to two NAND strings, the data stored at DRAM cell can be written to and/or from the two NAND strings by selecting one of NAND DSGs 605-606.

FIG. 8B shows another exemplary aspect of 3D hybrid NVM/DRAM device using interconnection layer 803. After connecting one DRAM to four NAND strings, data stored at the DRAM cell(s) can be written to and retrieved from one of four NAND strings. It should be noted that the application of interconnection layer provides flexibility to 3D hybrid NVM/DRAM whereby the ratio between the number of DRAM and NAND cells may be optimized. Note that the interconnection layer may reduce the number of DRAM cells whereby the DRAM cell pitch can be relaxed, as shown in FIG. 8A-B. FIG. 8C shows another aspect of 3D hybrid NVM/DRAM array in which the number of the DRAM select gates DWL0-1 and bit lines BL0-1 are reduced to one half. A benefit of the layout shown in FIG. 8C is to relax the pitch of the physical layout of hybrid NVM/DRAM array.

Figures 9A, 9B:
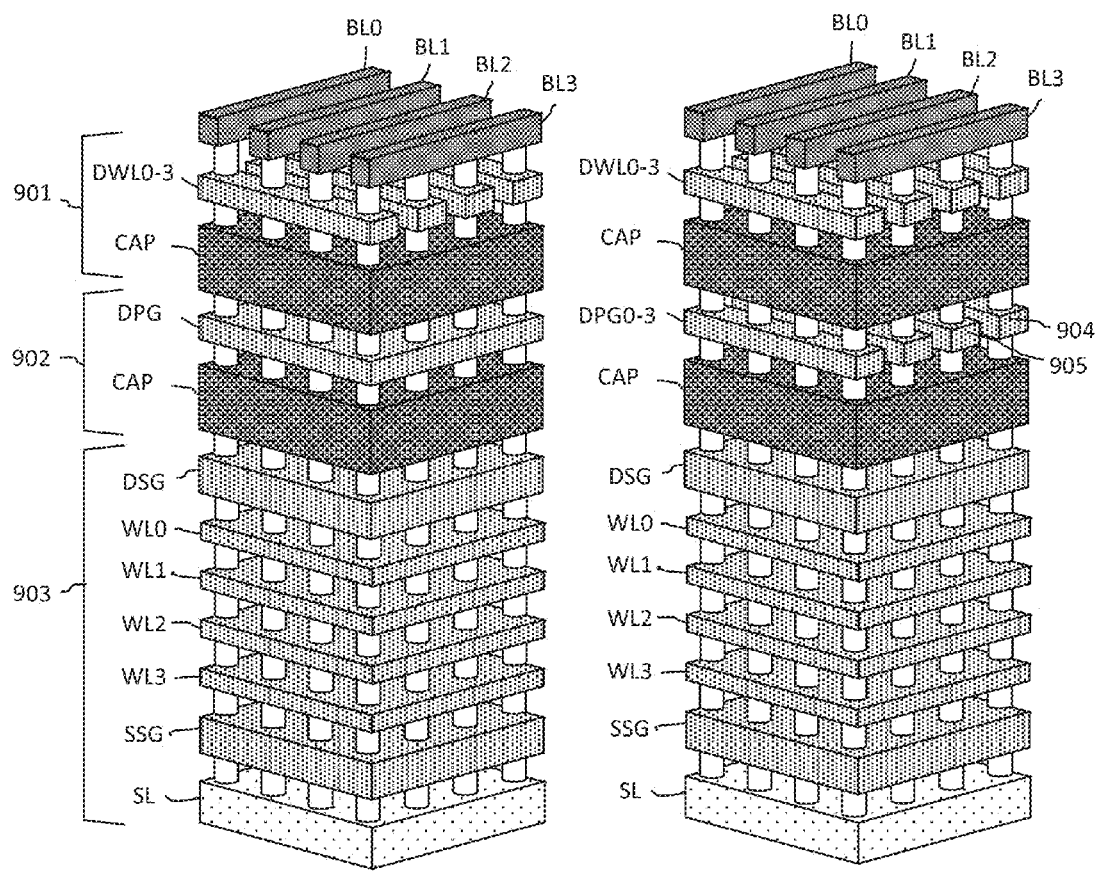
FIGS. 9A-B are 3D block diagrams showing physical layouts of 3D hybrid NVM/DRAM memory device using different configuration of DRAM pass gate ("DPG") in accordance with one embodiment of the present invention.

FIGS. 9A-B are 3D block diagrams showing different aspects of physical layouts of 3D NVM/DRAM using different configuration of DRAM pass gate ("DPG") in accordance with one embodiment of the present invention. FIG. 9A illustrates a hybrid 3D NVM/DRAM array structure containing a NAND NVM string 903, first DRAM cell 901, and second DRAM cell 902. Although the hybrid array structure shown in FIG. 9A contains two DRAM cells 901-902, the hybrid array structure can contain more than two DRAM cells per string. It should be noted that the underlying concept of the exemplary embodiment(s) of the present invention would not change if one or more blocks (or layers) were added to or removed from diagram FIGS. 9A-B.

In one aspect, the hybrid NVM/DRAM array contains DRAM cells 901-902 and NAND string 903 wherein DRAM cells 901-902 are stacked on top of NAND string 903. First DRAM cell 901 can be accessed by BL0-3 through selection(s) of DWL0-3. Second DRAM cell 902, in one embodiment, is configured to be accessible via the DRAM Pass Gate ("DPG"). During an operation, the hybrid NVM/DRAM structure allows a system to access first DRAM cell 901 while second DRAM cell 902 is writing or reading data to or from one or more NVM cells in NAND string 903.

For MLC (Multi-Level-Cell) application, two-bit data can be stored in two DRAM cells such as DRAM cells 901-902 simultaneously. After storage, the two-bit data can be written to NVM cells in NAND string 903. When performing a MLC read operation, two bit-data of a NAND cell can be read and stored in the two DRAM cells.

FIG. 9B shows another embodiment of hybrid 3D NVM/DRAM array structure which is similar to the structure shown in FIG. 9A except that multiple independent DPGs 904-905 are used to facilitate communication between DRAM cells. DPGs 904-905 or the pass gates can be selected and/or controlled by DPG0-3. An advantage of using independent DPGs 904-905 is that they allow a memory system to load data to partial second DRAM cells and to write to NVM cells in the NAND string.

Figures 10A, 10B:
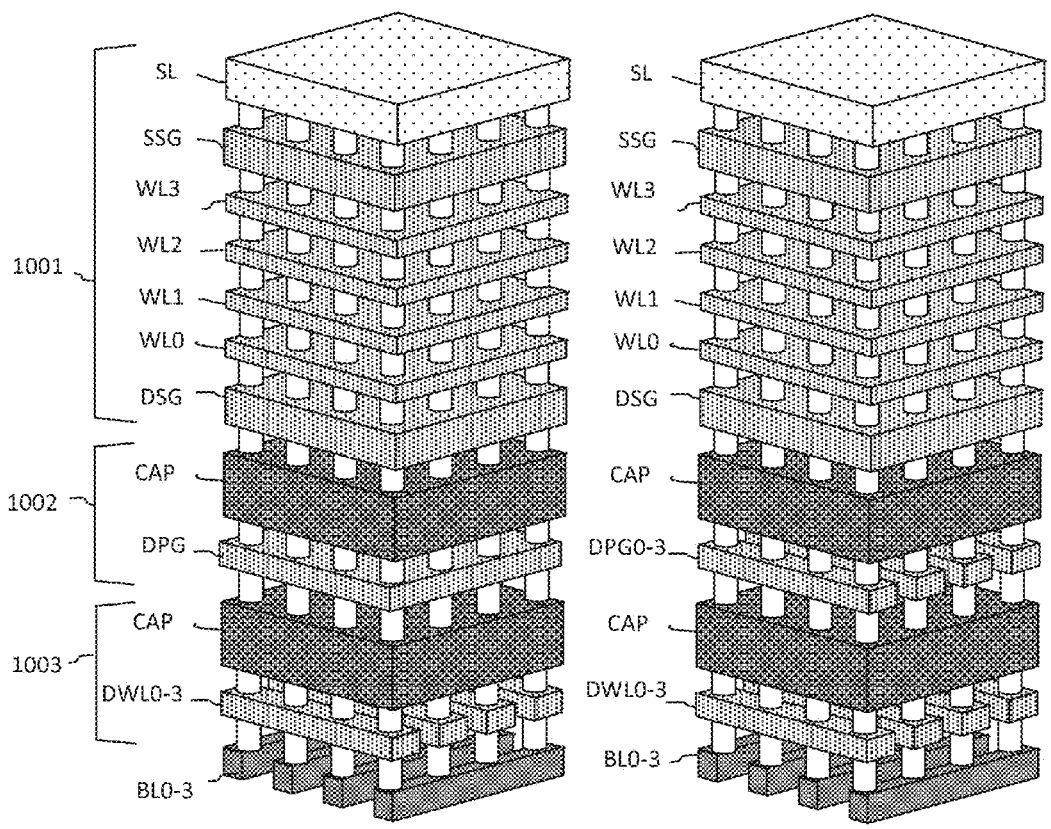
FIGS. 10A-B are 3D block diagrams showing alternative physical layouts of 3D hybrid NVM/DRAM memory device using different configuration of DRAM pass gate ("DPG") in accordance with one embodiment of the present invention.

FIGS. 10A-B are 3D block diagrams showing alternative physical layouts of 3D hybrid NVM/DRAM array structure using different configuration of DRAM pass gate ("DPG") in accordance with one embodiment of the present invention. FIG. 10A illustrates an exemplary embodiment of hybrid NVM/DRAM array structure containing a NAND string 1001 and DRAM cells 1002-1003. The hybrid NVM/DRAM array structure shown in FIG. 10A is similar to the array structure shown in FIG. 9A expect that DRAM cells 1002-1003 are located in the bottom of the structure closer to the substrate. NAND cells or NAND string 1001 is deposited on top of DRAM cells 1002-1003. In one aspect, multiple DPSs are used to facilitate communication between DRAM cells 1002-1003 and NAND string 1001. FIG. 10B shows another embodiment of 3D hybrid NVM/DRAM array structure which is similar to the structure shown in FIG. 10A expect that DPG situated between DRAM cells 1001-1002 is reconfigured into multiple independent or separated pass gate DPG0-3.

Figure 11A:
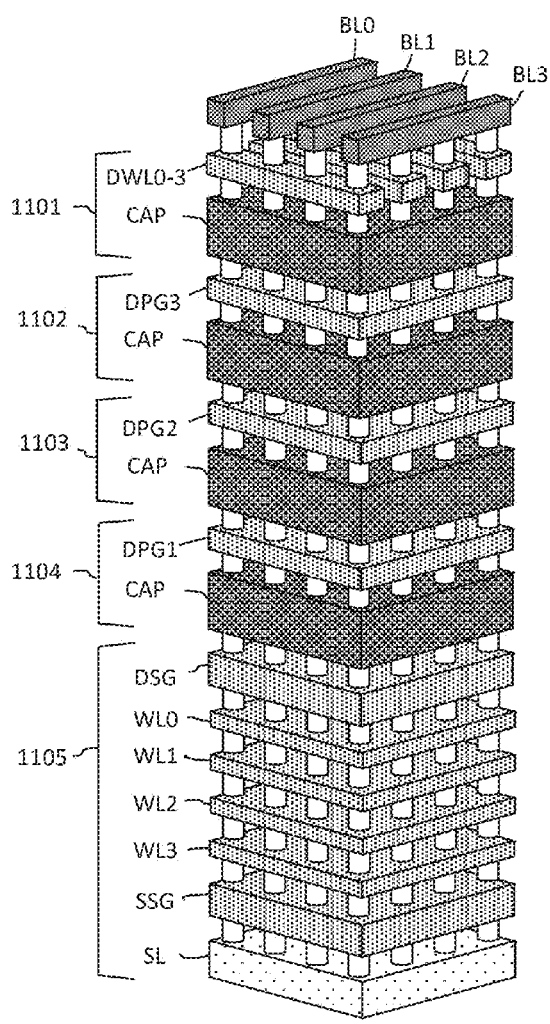
FIGS. 11A-B are 3D block diagrams showing physical layouts of 3D hybrid NVM/DRAM memory device having multiple capacitor layers in accordance with one embodiment of the present invention.
Figure 11B:
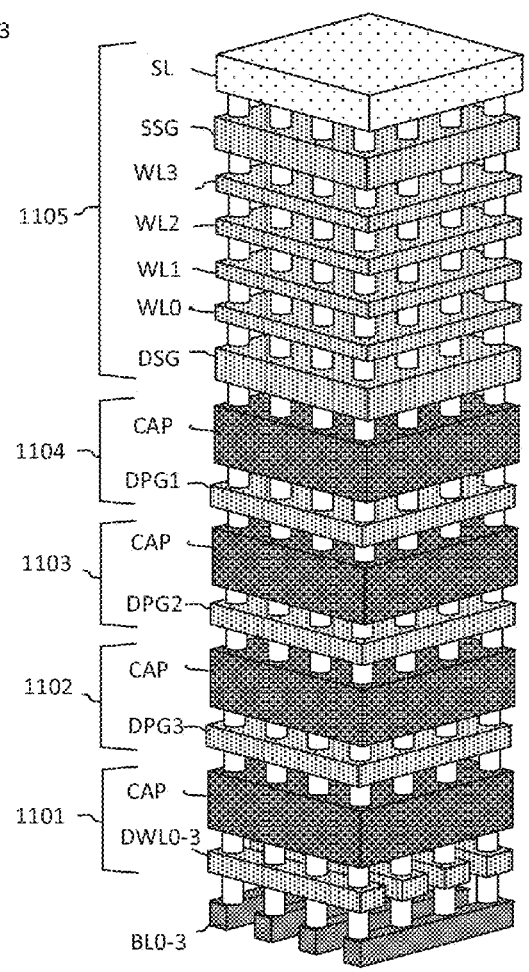

FIGS. 11A-B are block diagrams showing physical layouts of 3D hybrid NVM/DRAM array structure having multiple capacitor layers in accordance with one embodiment of the present invention. FIG. 11A illustrates a structure having four DRAM cells 1101-1104 disposed over NAND string 1105. Additional DRAM cells allow a system pipelining operation in which four pages of data, for example, can be loaded into four levels of DRAM cells 110-1104. The loaded data can be subsequently written to NVM cells in NAND string 1105 sequentially. FIG. 11B shows another embodiment of 3D hybrid NVM/DRAM array structure which is similar to the structure shown in FIG. 11A except DRAM cells 1101-1104 are located in the bottom of the structure. In one example, NAND cells or NAND string 1105 are located or deposited on top of DRAM cells.

It should be noted that a four-DRAM cell structure illustrated in FIGS. 11A-B is for the illustrative purposes and additional DRAM cells can be added to or removed from the 3D hybrid NVM/DRAM array structure.

Figure 12A:
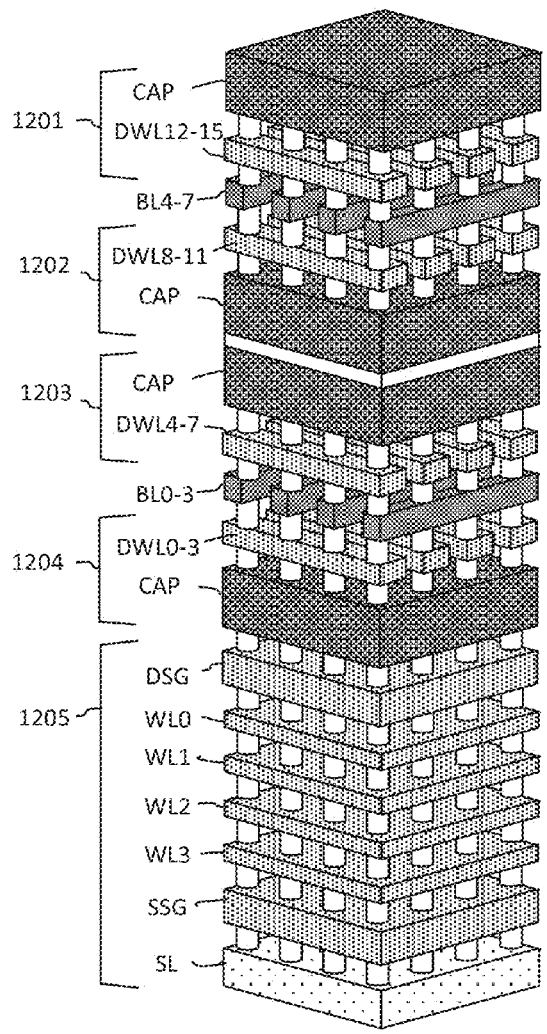
FIGS. 12A-B are 3D block diagrams showing alternative physical layouts of 3D hybrid NVM/DRAM memory device having multiple capacitor layers in accordance with one embodiment of the present invention.
Figure 12B:
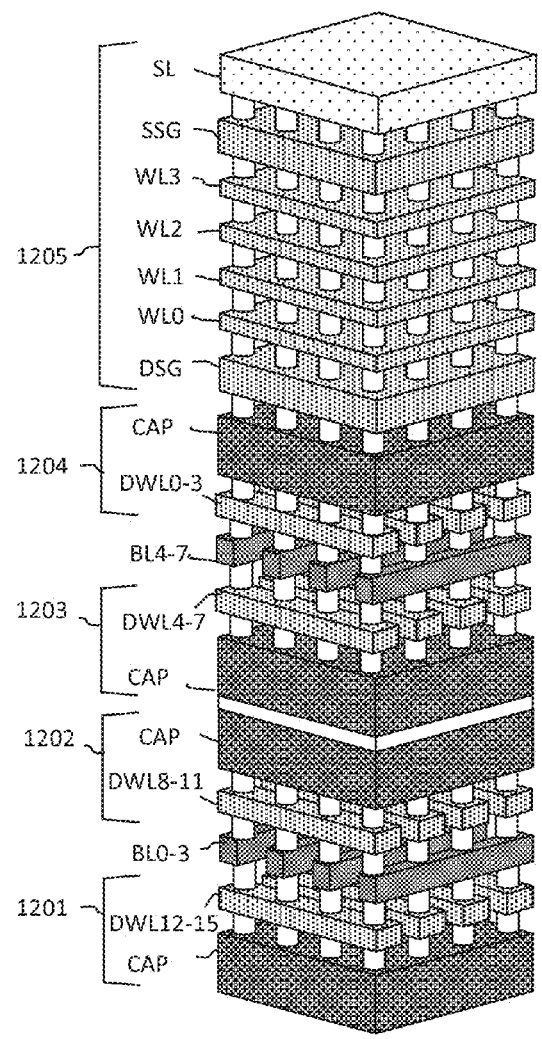

FIGS. 12A-B are 3D block diagrams showing alternative physical layouts of 3D hybrid NVM/DRAM array structure having multiple capacitor layers in accordance with one embodiment of the present invention. FIG. 12A shows a hybrid NVM/DRAM array structure containing multiple DRAM cells 1201-1204 stacked on top of NAND string 1205. In one embodiment, the DRAM cells such as DRAM cells 120201203 are connected in series. In one aspect, DRAM cells are disposed or fabricated in such a way that can connect to BLs in parallel which is known as an NOR array structure. The NOR array structure, in one example, allows a system to access the DRAM cells in fully random manner. FIG. 12B shows another embodiment of a hybrid NVM/DRAM array structure which is similar to the structure shown in FIG. 12A except that DRAM cells 1201-1204 are located or disposed in the bottom portion of the structure. In one aspect, NAND cells or NAND string 1205 is located or disposed on the top of DRAM cells 1201-1204. Note that the features of embodiments illustrated in FIGS. 11A and 12A can be combined in such a way that allows DRAM cells to have several levels in series and several levels in parallel.

Figure 13A:
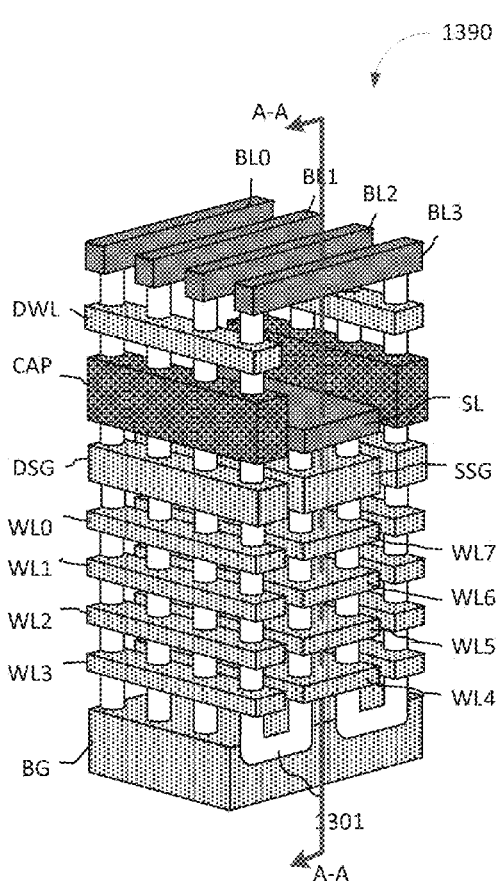
FIGS. 13A-B are 3D block diagrams showing physical layouts of 3D hybrid NVM/DRAM memory device using alternative vertical structures in accordance with one embodiment of the present invention.
Figure 13B:
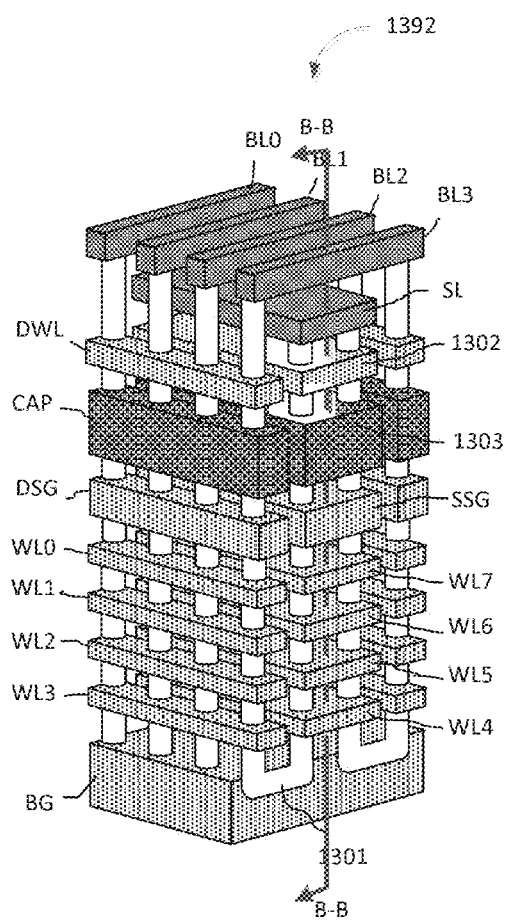

FIGS. 13A-B are 3D block diagrams showing physical layouts of 3D NVM/DRAM using alternative vertical structures in accordance with one embodiment of the present invention. FIG. 13A illustrates an embodiment of hybrid NVM/DRAM array structure 1390 which is related to structure 590 shown in FIG. 5A wherein structure 590 is a cross-section view of structure 1390 cutting along axis A-A. The NAND strings are a folded structure. The two folded strings are connected by pipe portions 1301. The BG (back gate) is used to turn in the channel of the pipe 1301. FIG. 13B shows another embodiment of 3D hybrid NVM/DRAM array structure 1392 which is also related to structure 592 shown in FIG. 5B. Structure 592 shown in FIG. 5B is a cross-section view of structure 1392 cutting along axis B-B. The hybrid array structure 1392 includes an extra DRAM cell 1303 in the SL side coupled to SL via select gate 1302.

Figure 14:
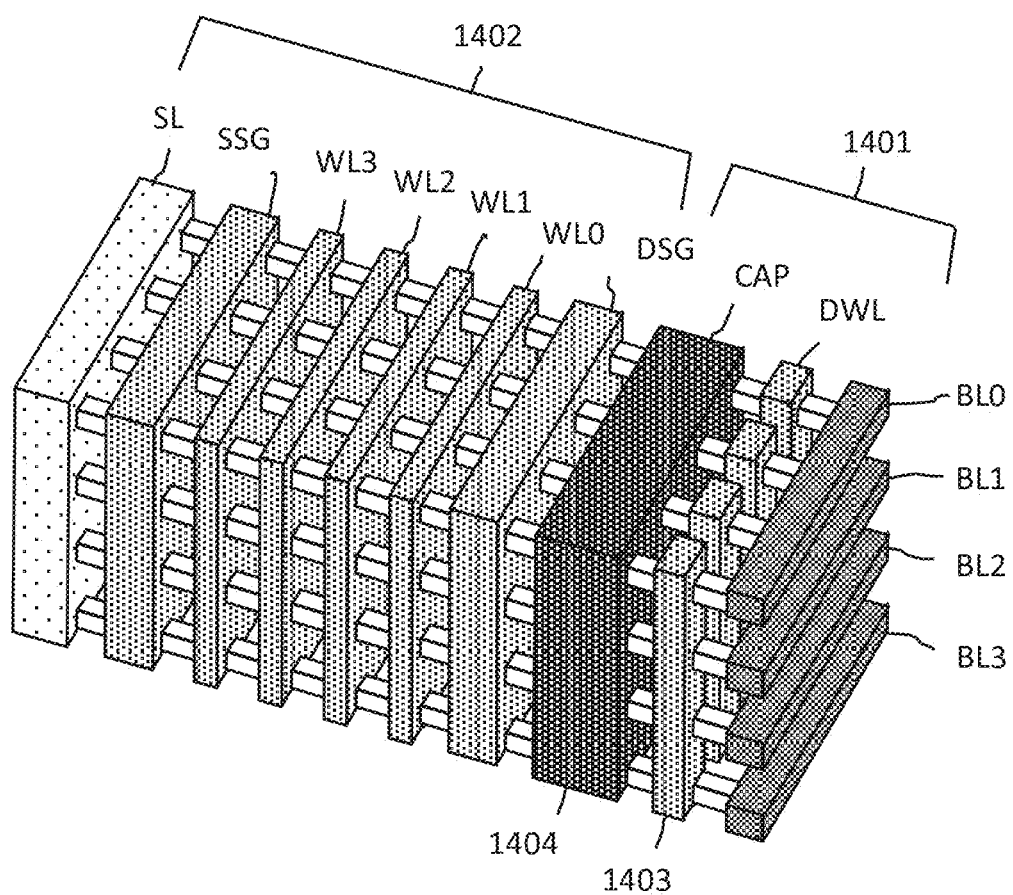
FIG. 14 is a 3D block diagram showing a sideway view of physical layouts of 3D hybrid NVM/DRAM memory device in accordance with one embodiment of the present invention.

FIG. 14 is a 3D block diagram showing a physical layout of hybrid NVM/DRAM array structure in accordance with one embodiment of the present invention. FIG. 14 shows a hybrid structure having a DRAM cell 1401 and NAND cells or string 1402 wherein the structure is located or disposed horizontally instead of vertically. In one embodiment, DRAM cell select gate 1403 and MOS capacitor 1404 are located or fabricated horizontally.

Figures 15A, 15B:
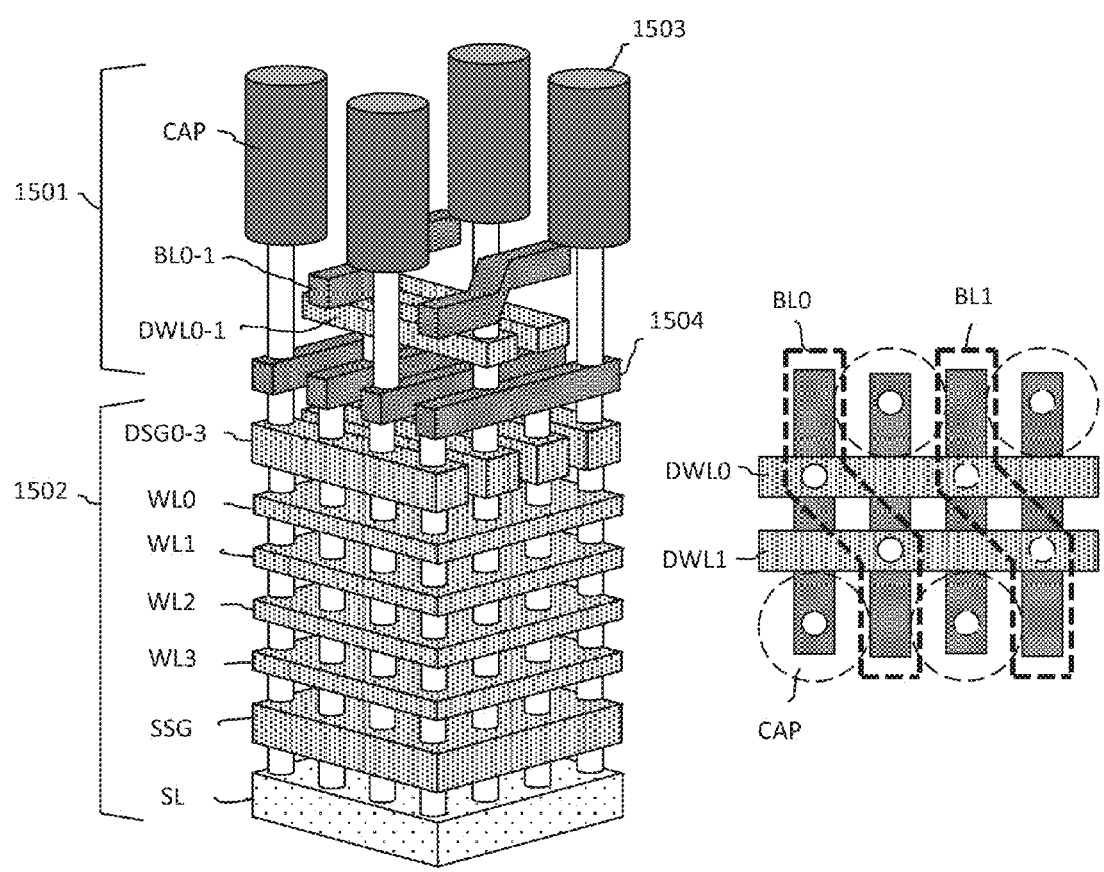
FIGS. 15-17 are 3D block diagrams showing physical layouts of 3D hybrid NVM/DRAM memory device using different capacitor layers in accordance with one embodiment of the present invention.

FIGS. 15-17 are 3D block diagrams showing physical layouts of hybrid NVM/DRAM array structures using different capacitor layers in accordance with one embodiment of the present invention. FIG. 15A shows an embodiment of hybrid NVM/DRAM array structure including multiple cylindrical capacitors 1503. It should be noted that other types of semiconductor capacitors, such as MOS capacitors, PIP (Polysilicon-Insulator-Polysilicon) capacitors, stack capacitors, and the like, can be used in place of cylindrical capacitors 1503. Due to the larger size of DRAM cell(s), DRAM cells 1501 may be located on the top of NAND strings 1502 and interconnection layer 1504 may be used to increase the DRAM cell pitch. The hybrid NVM/DRAM array structure shows each DRAM cell connects to four NAND cells. FIG. 15B shows a top view of the four DRAM cells coupled to vertical select gates DWL0-1.

Figures 16A, 16B:
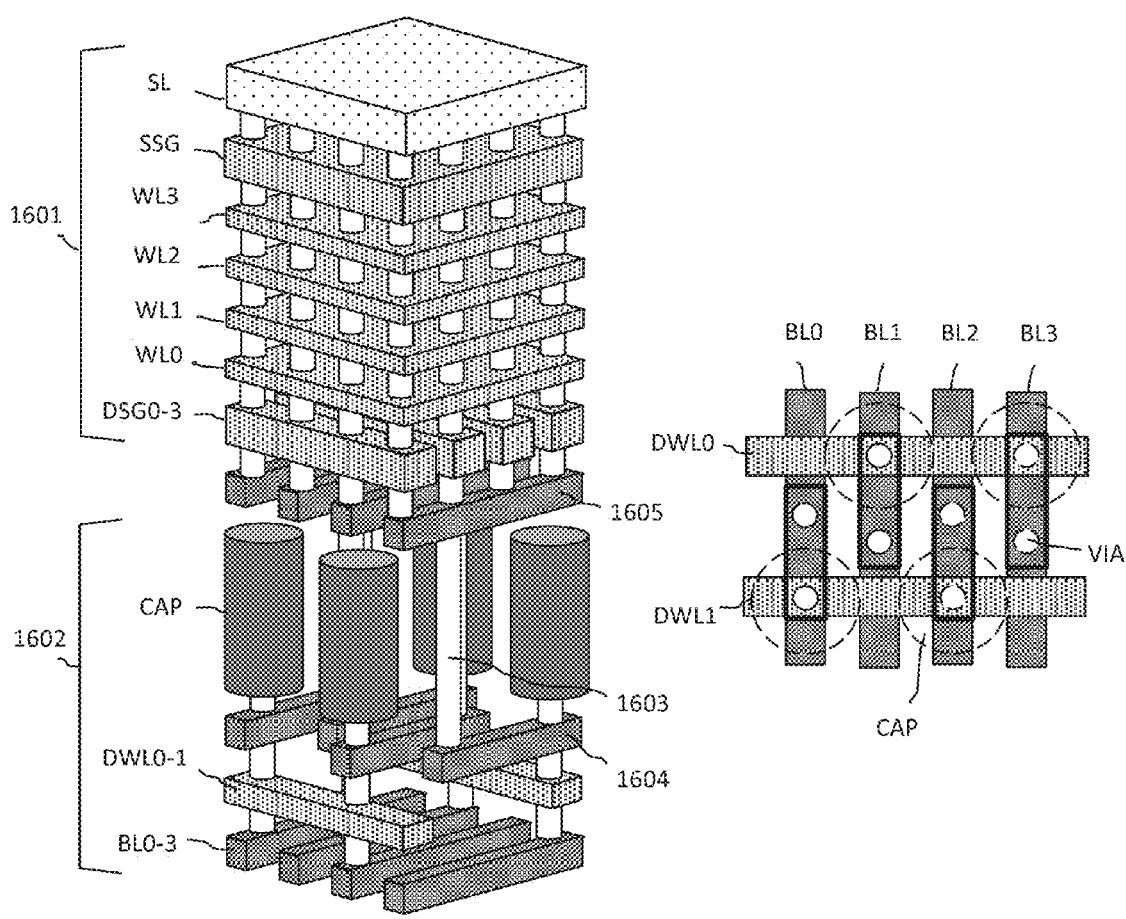

FIG. 16A shows an alternative configuration of 3D hybrid NVM/DRAM array structure which is similar to the structure shown in FIG. 15A expect that DRAM cells 1602 are located at the lower portion of the structure underneath NAND string(s) 1601. To connect DRAM cells 1602 to NAND string(s) 1601, multiple via and/or paths 1603 are used to connect lower interconnection 1604 to upper interconnection 1605. An advantage of placing DRAM cells at the lower portion of the structure closer to the substrate is that it allows onboard logic or CPU to easily access the DRAM cells. In one aspect, each DRAM cell is connected to four NAND cells to increase DRAM cell's pitch. FIG. 16B shows a top view of the four DRAM cells CAP using 3D vertical select gates DWL0-1.

Figures 17A, 17B:
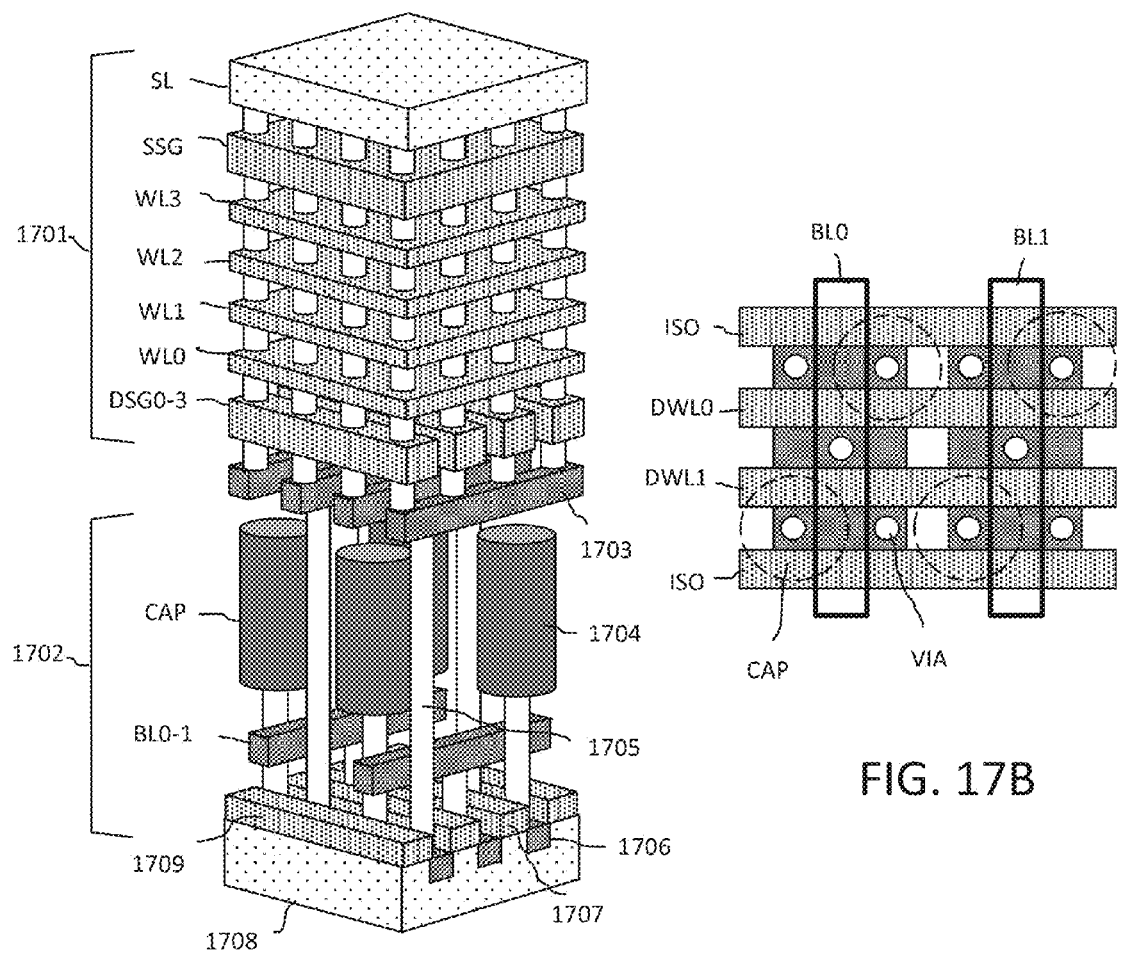

FIG. 17A illustrates a 3D physical layout of hybrid NVM/DRAM array structure which can be fabricated via a 2D process of DRAM cells. In one embodiment, DRAM cells 1702 are located below NAND strings 1701 and above substrate or well 1708. DRAM cells 1702 contain PIP capacitors 1704 and MOS select gate 1707. Source and drain diffusions 1706 are deposited on substrate 1708. An isolation gate ("ISO") 1709 is used to isolate or separate an active region of the cell from an adjacent cell. Since DRAM cells 1702 are located on substrate 1708, DRAM cells 1702 are connected to NAND strings 1701 using VIA 1705. In one aspect, multiple interconnection bars 1703 are used to facilitate communication between each DRAM cell and four NAND cells of string 1701. FIG. 17B shows a top view of the four DRAM cells Cap connected to NVM cells via vertical select gates.

The exemplary aspect of the present invention includes various processing steps, which will be described below. The steps of the aspect may be embodied in machine or computer executable instructions. The instructions can be used to direct a general purpose or special purpose system, which is programmed with the instructions, to perform the steps of the exemplary aspect of the present invention. Alternatively, the steps of the exemplary aspect of the present invention may be performed by specific hardware components that contain hard-wired logic for performing the steps, or by any combination of programmed computer components and custom hardware components.

Figure 18:
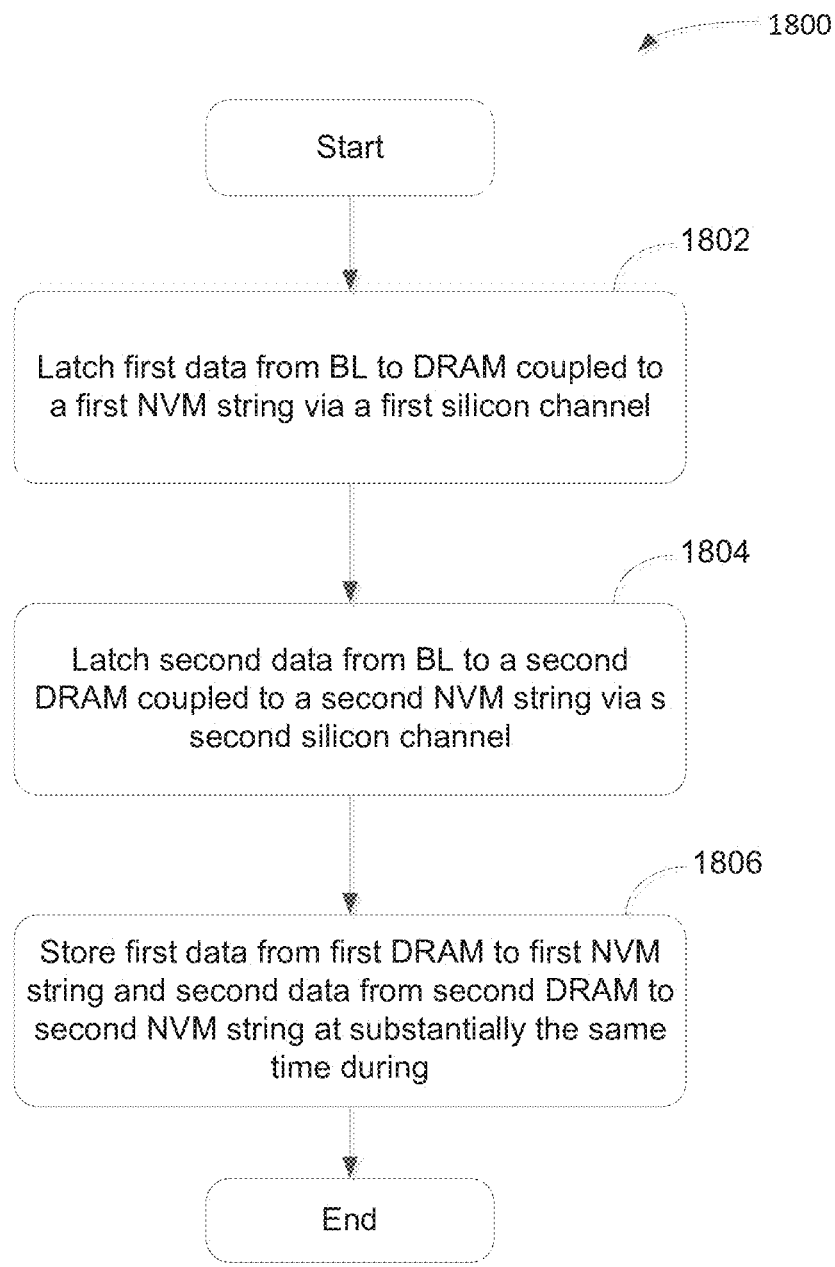
FIG. 18 is a flow chart illustrating an operation of 3D hybrid NVM/DRAM memory device in accordance with one embodiment of the present invention.

FIG. 18 is a flow chart 1800 illustrating an operation of hybrid NVM/DRAM storage device in accordance with one embodiment of the present invention. At block 1802, a process for concurrent multiple pages programming in a hybrid NVM/DRAM storage device latches first data from a BL to a first DRAM cell when a first DSG is activated during a first time frame. The first DRAM cell is coupled to a first NVM string via a first silicon channel.

At block 1804, second data is latched from the BL to a second DRAM cell when a second DSG is activated during the first time frame. Note that the second DRAM cell is coupled to a second NVM string via s second silicon channel.

At block 1806, the first data from the first DRAM cell is stored to the first NVM string and the second data from the second DRAM is stored to the second NVM string at the substantially same time during a second time frame in response to voltage values of multiple WLs when a write DSG signal is activated. The process is also capable of deactivating SSG signals and activating a source line signal prior activating the WLs. The process is further able to allow the first data to travel from the first DRAM cell to the first NVM string via a first silicon channel in a direction toward the substrate.

Figure 19:
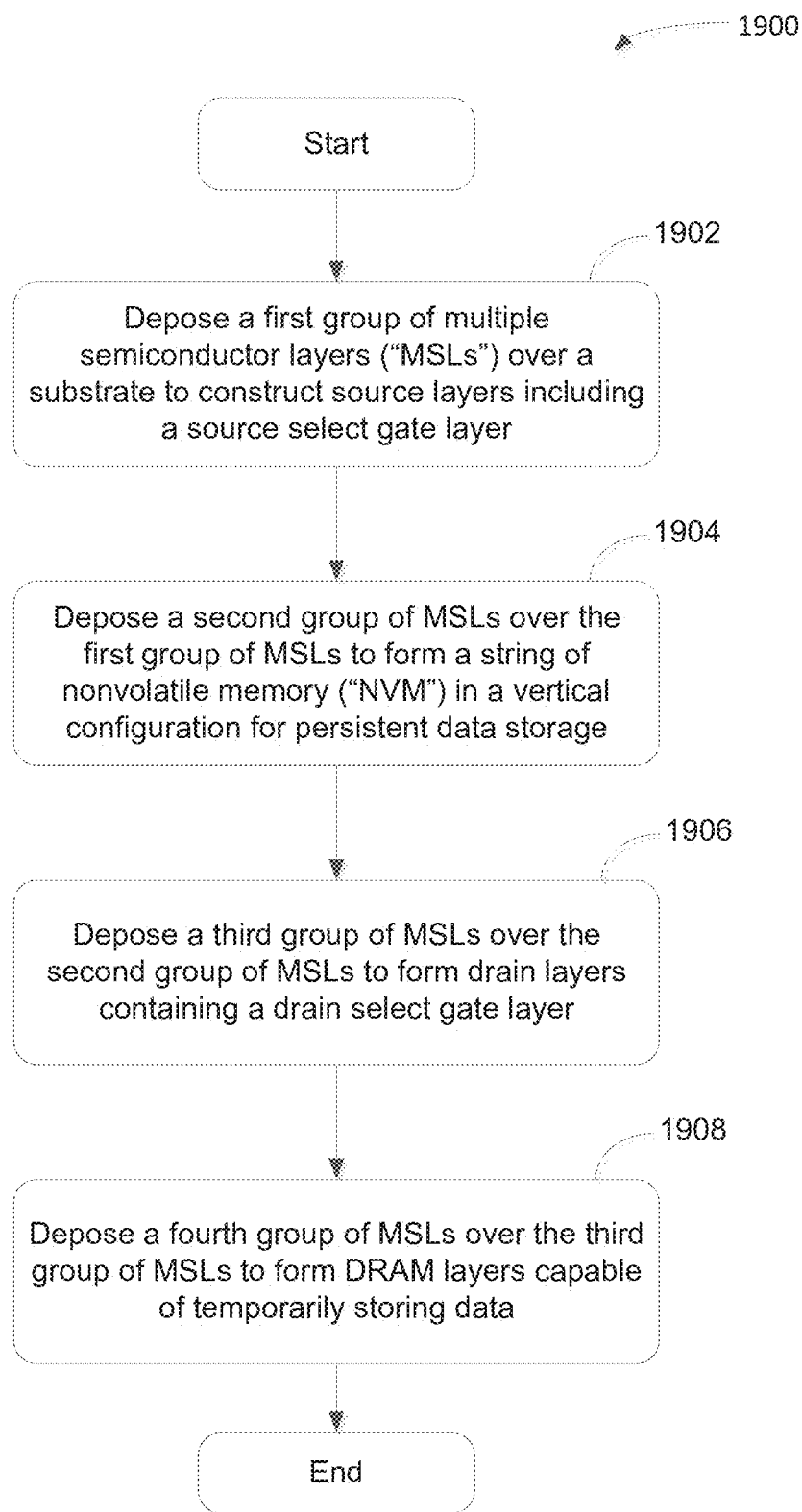
FIG. 19 is a flow chart illustrating a process showing a fabrication procedure of 3D NVM/DRAM storage device in accordance with one embodiment of the present invention.

FIG. 19 is a flow chart 1900 illustrating a process showing a fabrication procedure of 3D NVM/DRAM storage device in accordance with one embodiment of the present invention. At block 1902, a process for generating a 3D hybrid NVM/DRAM storage device deposes a first group of multiple semiconductor layers ("MSLs") over a substrate to construct source layers including a source select gate layer.

At block 1904, a second group of MSLs is deposited over the first group of MSLs to form a string of NVM cells in a vertical configuration for persistent data storage. In one embodiment, 32 NVM cells are stacked in a vertical direction away from the substrate for persistent data storage.

At block 1906, the process is able to dispose a third group of MSLs over the second group of MSLs to form drain layers containing at least one drain select gate layer.

At block 1908, a fourth group of MSLs is disposed over the third group of MSLs to form DRAM layers capable of temporarily storing data. A fifth group of MSLs is disposed over the fourth group of MSLs to form DRAM word line ("DWL") layers for providing capacitance management. In one embodiment, the process is capable of disposing at least one capacitance layer within the fourth group of MSLs capable of trapping electrical charges for data storage.

While particular embodiments of the present invention have been shown and described, it will be obvious to those of ordinary skills in the art that based upon the teachings herein, changes and modifications may be made without departing from this exemplary embodiment(s) of the present invention and its broader aspects. Therefore, the appended claims are intended to encompass within their scope all such changes and modifications as are within the true spirit and scope of this exemplary embodiment(s) of the present invention.

What is claimed is:

1. A memory device able to store information, comprising:
   a plurality of memory components able to store information, each of the plurality of memory components having a source terminal, a gate terminal, a drain terminal, and a nonvolatile cell, wherein the plurality of memory components is organized in a string and the memory components are interconnected between source terminals and drain terminals;
   a first drain select gate ("DSG") transistor having a source terminal, a drain terminal, and a gate terminal, the drain terminal of the first DSG transistor coupling to the source terminal of the plurality of memory components, the gate terminal of the first DSG transistor coupled to a first DSG signal; and
   a capacitor component having a source terminal, a drain terminal, and a gate terminal, wherein the capacitor component is physically situated adjacent to the string and connects the drain terminal of the capacitor to the source terminal of the first DSG transistor, wherein the capacitor component is configured to perform a dynamic random-access memory ("DRAM") function.

2. The device of claim 1, further comprising a second DSG transistor having a source terminal, a drain terminal, and a gate terminal, the draining terminal of the second DSG transistor coupled to the source terminal of the capacitor component.

3. The device of claim 2, further comprising a source select gate ("SSG") component having a source terminal, a drain terminal, and a gate terminal, the source terminal of the SSG component coupled to a drain terminal of one of the plurality of memory components organized in the string.

4. The device of claim 3, wherein the gate terminal the SSG component is coupled to an SSG signal, and the drain terminal of the SSG component is coupled to a source line.

5. The device of claim 3, wherein the gate terminal the second DSG component is coupled to a DSG signal, and the source terminal of the second DSG component is coupled to a bit line.

6. The device of claim 3, wherein the plurality of memory components is NAND based flash memory.

7. The device of claim 3, wherein each gate terminal of the plurality of memory components is coupled to a unique word line.

8. The device of claim 1, wherein the plurality of memory components is Silicon-Oxide-Nitride-Oxide-Silicon ("SONOS") based nonvolatile memory storages.

9. The device of claim 3, wherein the plurality of memory components, the first DSG transistor, the second DSG transistor, and the capacitor component are configured in stacking structure of a three dimensional ("3D") layout.

10. The device of claim 9, wherein the capacitor component is physically situated over the plurality of memory components in the 3D layout.

11. A nonvolatile memory system capable of storing data comprising multiple sets of the plurality of memory components structured in 3D layout of claim 10.

12. A memory device able to store information, comprising:
a plurality of non-volatile memory ("NVM") components able to store information persistently, the plurality of NVM components is organized in a string and are interconnected between source terminals and drain terminals;
a drain select gate ("DSG") transistor having a source terminal, a drain terminal, and a gate terminal, the drain terminal of the DSG transistor connected to the source terminal of the plurality of NVM components, the gate terminal of the DSG transistor connected to a DSG signal; and
a capacitor component having a source terminal, a drain terminal, and a gate terminal, wherein the capacitor component is physically situated adjacent to the string, and the drain terminal of the capacitor is physically connected to the source terminal of the first DSG transistor and the source terminal the capacitor is electrically coupled to a bit line, wherein the capacitor component is configured to perform a dynamic random-access memory ("DRAM") function.

13. The device of claim 12, further comprising a second DSG transistor having a source terminal, a drain terminal, and a gate terminal, the draining terminal of the second DSG transistor coupled to the source terminal of the capacitor component.

14. The device of claim 13, further comprising a source select gate ("SSG") component having a source terminal, a drain terminal, and a gate terminal, the source terminal of the SSG component coupled to a drain terminal of one of the plurality of memory components organized in the string.

15. The device of claim 14, wherein the gate terminal the SSG component is coupled to an SSG signal, and the drain terminal of the SSG component is coupled to a source line.

16. The device of claim 14, wherein the gate terminal the second DSG transistor is coupled to a DSG signal, and the source terminal of the second DSG transistor is coupled to a bit line.

17. The device of claim 16, wherein the plurality of NVM components is NAND based flash memory.

18. The device of claim 14, wherein each gate terminal of the plurality of NVM components is coupled to a unique word line.

19. The device of claim 12, wherein the plurality of NVM components is Silicon-Oxide-Nitride-Oxide-Silicon ("SONOS") based nonvolatile memory storages.

20. The device of claim 14, wherein the plurality of NVM components, the first DSG transistor, the second DSG transistor, and the capacitor component are configured in stacking structure of a three dimensional ("3D") layout.

21. The device of claim 20, wherein the capacitor component is physically situated over the plurality of NVM components in the 3D layout.

22. A nonvolatile memory system capable of storing data comprising multiple sets of the plurality of NVM components structured in 3D layout of claim 12.

* * * * *